(12) United States Patent
Kalevo et al.

(10) Patent No.: US 10,333,547 B2
(45) Date of Patent: Jun. 25, 2019

(54) ENCODER AND METHOD FOR ENCODING INPUT DATA USING A PLURALITY OF DIFFERENT TRANSFORMATIONS OR COMBINATIONS OF TRANSFORMATIONS

(71) Applicant: GURULOGIC MICROSYSTEMS OY, Turku (FI)

(72) Inventors: Ossi Mikael Kalevo, Akaa (FI); Tuomas Kärkkäinen, Turku (FI)

(73) Assignee: GUROLOGIC MICROSYSTEMS OY, Turku (FI)

( * ) Notice: Subject to any disclaimer, the term of this patent is extended or adjusted under 35 U.S.C. 154(b) by 202 days.

(21) Appl. No.: 15/017,750

(22) Filed: Feb. 8, 2016

(65) Prior Publication Data

US 2016/0156367 A1  Jun. 2, 2016

Related U.S. Application Data

(63) Continuation-in-part of application No. 14/163,820, filed on Jan. 24, 2014, now Pat. No. 9,258,389, which
(Continued)

(30) Foreign Application Priority Data

Aug. 13, 2012  (GB) .................................. 1214414.3

(51) Int. Cl.
*H04N 19/12*  (2014.01)
*H04N 19/192*  (2014.01)
(Continued)

(52) U.S. Cl.
CPC ....... *H03M 7/3055* (2013.01); *H03M 7/3053* (2013.01); *H03M 7/3066* (2013.01);
(Continued)

(58) Field of Classification Search
CPC .. H04N 19/154; H04N 19/136; H04N 19/192; H04N 19/172; H04N 19/119;
(Continued)

(56) References Cited

U.S. PATENT DOCUMENTS 5,832,130 A  11/1998  Kim
6,452,970 B1  9/2002  Kaup
(Continued)

FOREIGN PATENT DOCUMENTS

CN  1750656 A  3/2006
CN  1757240 A  4/2006
(Continued)

OTHER PUBLICATIONS

Notice of Allowance of Patent issued by the Korean Intellectual Property Office in relation to Korean Patent Application No. 10-2013-0095364 dated Oct. 13, 2016 (7 pages) along with the English language translation dated Oct. 13, 2016 (2 pages).
(Continued)

*Primary Examiner* — Nathnael Aynalem
(74) *Attorney, Agent, or Firm* — Robert P. Michal, Esq.; Carter, DeLuca & Farrell LLP

(57) ABSTRACT

An encoder includes data processing hardware operable to: process input data into a plurality of blocks/packets; apply a plurality of transformations to content of the blocks/packets to generate corresponding transformed data; check a quality of representation of the transformed data prior to application of the transformations to determine whether or not the quality of representation of the transformed data satisfies quality criteria; if the quality of representation does not satisfy the quality criteria, to divide and/or combine the one or more individual blocks or packets further and repeating the transformation step; and if the quality of representation of the transformed data satisfies the one or more quality
(Continued)

criteria, to select coding methods and encode data representative of the input data to be encoded to provide encoded output data; and communicate in the encoded data information describing the plurality of transformations or combinations of transformations employed when coding the blocks/packets.

35 Claims, 12 Drawing Sheets

Related U.S. Application Data is a continuation-in-part of application No. 13/584,005, filed on Aug. 13, 2012, now Pat. No. 8,675,731.

(51) Int. Cl.
| | |
|---|---|
| *H04N 19/60* | (2014.01) |
| *H03M 7/30* | (2006.01) |
| *H03M 7/40* | (2006.01) |
| *H03M 7/46* | (2006.01) |
| *H04L 29/06* | (2006.01) |
| *H04N 19/119* | (2014.01) |
| *H04N 19/172* | (2014.01) |
| *H04N 19/136* | (2014.01) |
| *H04N 19/154* | (2014.01) |
| *H04N 19/96* | (2014.01) |
| *H04N 19/46* | (2014.01) |

(52) U.S. Cl.
CPC ....... *H03M 7/3086* (2013.01); *H03M 7/3097* (2013.01); *H03M 7/4031* (2013.01); *H03M 7/4093* (2013.01); *H03M 7/46* (2013.01); *H03M 7/705* (2013.01); *H04L 69/04* (2013.01); *H04L 69/22* (2013.01); *H04N 19/119* (2014.11); *H04N 19/12* (2014.11); *H04N 19/136* (2014.11); *H04N 19/154* (2014.11); *H04N 19/172* (2014.11); *H04N 19/192* (2014.11); *H04N 19/46* (2014.11); *H04N 19/96* (2014.11)

(58) Field of Classification Search
CPC ........ H04N 19/12; H04N 19/60; H04N 19/17; H04N 19/176; H04N 19/33; H04N 19/00781; H04N 19/00278; H04N 19/00157; H04N 19/00266; H04N 19/00775; H04N 19/00066; H04N 19/00357; H04N 19/00818; H04N 19/00909; H04N 19/0026; H04N 19/00078; H04N 19/00848; H04N 19/00903; H04N 7/30; H04N 19/00006; H04N 19/00272; H04N 19/102; H04N 19/10; H04N 19/122; H04N 19/174; H04N 19/194; H04N 19/88; H04N 7/26244; H04N 7/26319; H04N 19/46; H04N 19/00; H04N 9/78; H04N 9/7921; H04N 9/8047; G06T 9/007; G06T 2207/20021; G06T 2207/20052
USPC ........................... 375/240.01–240.29
See application file for complete search history.

(56) References Cited

U.S. PATENT DOCUMENTS

| | | | |
|---|---|---|---|
| 6,529,634 B1 | 3/2003 | Thyagarajan et al. | |
| 7,379,496 B2 | 5/2008 | Holcomb et al. | |
| 7,676,101 B2 | 3/2010 | Sato et al. | |
| 7,706,622 B2 | 4/2010 | Kobayashi | |
| 7,995,849 B2 | 8/2011 | Raveendran et al. | |
| 8,018,994 B2 | 9/2011 | Tong et al. | |
| 8,270,738 B2 | 9/2012 | Raveendran et al. | |
| 2002/0136296 A1* | 9/2002 | Stone | H04N 19/176 375/240.03 |
| 2004/0208392 A1 | 10/2004 | Raveendran et al. | |
| 2005/0249291 A1* | 11/2005 | Gordon | H04N 19/159 375/240.18 |
| 2005/0259730 A1* | 11/2005 | Sun | H04N 11/042 375/240.03 |
| 2006/0013235 A1 | 1/2006 | Farnham | |
| 2006/0204115 A1* | 9/2006 | Burazerovic | H04N 19/115 382/239 |
| 2006/0251330 A1 | 11/2006 | Toth et al. | |
| 2007/0110153 A1* | 5/2007 | Cho | H04N 19/176 375/240.12 |
| 2009/0097571 A1* | 4/2009 | Yamada | H04N 19/197 375/240.25 |
| 2010/0086049 A1* | 4/2010 | Ye | H04N 19/176 375/240.16 |
| 2011/0268183 A1* | 11/2011 | Sole | H04N 19/70 375/240.03 |
| 2012/0027083 A1 | 2/2012 | Narroschke et al. | |

FOREIGN PATENT DOCUMENTS

| | | |
|---|---|---|
| CN | 1784011 A | 6/2006 |
| CN | 102301707 A | 12/2011 |
| CN | 102495878 A | 6/2012 |
| EP | 1370087 A1 | 12/2003 |
| EP | 1 950 973 A1 | 7/2008 |
| GB | 2 274 754 A | 8/1994 |
| JP | 2006-074728 A | 3/2006 |
| JP | 2007-243427 A | 9/2007 |
| JP | 2009-194474 A | 8/2009 |
| KR | 10-2001-0031548 | 4/2001 |
| KR | 10-2005-0105271 | 11/2005 |
| KR | 10-2006-0027795 | 3/2006 |
| KR | 10-2012-0003863 | 1/2012 |
| WO | 2010087807 A1 | 8/2010 |
| WO | WO 2010/087807 A1 | 8/2010 |

OTHER PUBLICATIONS

English translation of relevant portions of Decision of Rejection issued by the Japanese Patent Office in relation to Japanese Patent Application No. 2013-165758 dated Mar. 30, 2016 (7 pages).
Office Action issued by the State Intellectual Property Office of People's Republic of China in relation to Chinese Application No. 201310344466.9 dated Mar. 3, 2016 (9 pages) with English Translation (12 pages).
Extended European Search Report issued by the European Patent Office in relation to European Patent Application No. 16020171.1-1908 dated Jun. 30, 2016 (15 pages).
Han Oh et al., "H.264-Based Depth Map Sequence Coding Using Motion Information of Corresponding Texture Video", Jan. 1, 2006, Advances in Image and Video Technology Lecture Notes in Computer Science; LNCS, Springer, Berlin, DE, pp. 898-907, XP019052993, ISBN: 973-3-540-68297-4.
Steven L. Horowitz et al., "Picture Segmentation by a Tree Traversal Algorithm", Journal of the Association for Computing Machinery, ACM, New York, NY, US, vol. 23, No. 2, Jan. 1, 1976, pp. 368-388, XP008085213, ISSN: 0004-5411, DOI: 10.1145/321941. 321956.
Second Office Action issued by the State Intellectual Property Office of People's Republic of China in relation to Chinese Application No. 201310344466.9 dated Dec. 20, 2016 (10 pages) with English Translation (14 pages).
Bumshik Lee et al "A hierarchical variable-sized block . . . ", 2010 Picture Coding Symposium (PCS 2010); Nagoya, Japan, Dec. 8-10, 2010, IEEE, Piscataway, NJ, pp. 522-525.
European Search Report dated Nov. 20, 2013 issued in European Application No. 13002521.6-1908, 9 pages.
SearCh Report under Section 17 dated Oct. 26, 2012 issued by the U.K. Patent Office in related U.K. Application No. GB 12144143.3 (4 pages).

(56) References Cited

OTHER PUBLICATIONS

Notification of Ground of Rejection, dated Jul. 2, 2014, issued by Japanese Patent Office in a related Japanese Patent Application No. 2013-165759 and its partial English translation of relevant portions (16 pages).
European Office Action, dated Dec. 12, 2014, issued by European Patent Office in a related European Patent Application No. 13012521.6-1908 (6 pages).
Russian Office Action dated Nov. 24, 2014 issued by the Russian Patent Office in related Russian Patent Application No. 2013137368/08, along with an English language translation (7 pages).
Japanese Office Action, dated Apr. 1, 2015, issued by Japanese Patent Office in a related Japanese Patent Application No. 2013-165758 (5 pages) and English language translation (7 pages).
Examination Report issued by the Intellectual Property India in relation to Indian Application No. 2340/MUM/2013 dated Oct. 31, 2018 (5 pages).
"A Hierarchical Variable-Sized Block Transform Coding Scheme for Coding Efficiency Improvement on H.264/AVC", 2010 Picture Coding Symposium (PCS 2010) : Nagoya, Japan, Dec. 8-10, 2010, IEEE, Piscataway, NJ, (Dec. 8, 2010), doi:10.1109/PCS.2010.5702553, ISBN 978-1-4244-7134-8.

\* cited by examiner

E => E1, E2, E3, E4
E3 => E31, E32, E33, E34

C => C1, C2, C3, C4

F => F1, F2, F3, F4
F1 => F11, F12, F13, F14

The combine bits for combinations inside init blocks –
between blocks that have the same size, init block C: 0011

The combine bits for combinations inside init blocks – between blocks that have the same size, init block E:
10:

0011:

The combine bits for combinations inside init blocks – between blocks that have the same size, init block F:
11:

0011:

The combine bits for combinations inside init blocks –
between blocks that do not have the same size, init blocks E and F: 111

Combine bits for combinations between init blocks –
between same- and different-sized blocks: 1101111

State before combining

1.   1101111

2.   1101111

3.   1101111

4.   1101111

5.   1101111

6.   1101111

7.   1101111

Final state after combining

| Bit | Combine |
|---|---|
| 1 | A + B |
| 1 | A + D |
| 0 | B + C1 |
| 1 | B + C2 |
| 1 | B + E1 |
| 1 | C3 + F11 |
|   | (C3 + F12) |
|   | (D + E33) |
|   | (E2 + F11) |
|   | (E2 + F13) |
| 1 | E4 + F3 |

1 = combine
0 = no combine

ENCODER AND METHOD FOR ENCODING INPUT DATA USING A PLURALITY OF DIFFERENT TRANSFORMATIONS OR COMBINATIONS OF TRANSFORMATIONS

CROSS-REFERENCE TO RELATED APPLICATIONS

This is a continuation-in-part of U.S. patent application Ser. No. 14/163,820 filed Jan. 24, 2014 (now, U.S. Pat. No. 9,258,389 issued Feb. 9, 2016) which is a continuation-in-part of U.S. patent Ser. No. 13/584,005, filed Aug. 13, 2012 (now, U.S. Pat. No. 8,675,731 issued Mar. 18, 2014), which claims the benefit under 35 USC 119(a) and 37 CFR 1.55 to UK Patent Application No. 1214414.3 filed on Aug. 13, 2012, the entire contents of each of which is incorporated herein by reference.

TECHNICAL FIELD

The present disclosure relates to encoders for receiving input data and encoding the input data to generate corresponding encoded output data. Moreover, the present disclosure also concerns methods of encoding input data to generate corresponding encoded output data. Furthermore, the present disclosure also concerns software products recorded on non-transitory machine-readable data storage media, wherein the software products are executable upon computing hardware for implementing the aforesaid methods.

BACKGROUND INFORMATION

Data content is stored and communicated to an increasing extent by contemporary human population, for example multimedia content via the Internet and wireless communication networks; such multimedia content often includes, for example, images, video and audio, but is not limited thereto. The data content is stored and communicated between devices, software applications, media systems and data services. During such storage and communication, situations arise where images and video are captured, scanned, transmitted, shared, watched and printed. However, such images and videos are demanding in respect of data memory capacity and communication system bandwidth that is utilized. When communication system bandwidth is limited, such images and videos take significant time to communicate. For addressing such storage requirements, it has been a customary practice to employ image and video encoding methods which also provide a degree of data compression. Some contemporary encoding standards for images and video are provided in Table 1.

TABLE 1

Contemporary Encoding Standards

| JPEG | MPEG-1 | H.261 | WebP | Lucid |
|---|---|---|---|---|
| JPEG2000 | MPEG-2 | H.263 | WebM | GIF |
| JPEG XR | MPEG-4 | H.264 | | PNG |
| | MPEG-4 AVC | HEVC | | TIFF |
| | MPEG-4 MVC | | | BMP |
| | MP3 | | | VC-1 |
| | | | | Theora |
| | | | | AAC |
| | | | | FLAC |
| | | | | Ogg Vorbis |
| | | | | Speex |

Image and audio files are becoming larger as image quality is progressively improved, for example by adoption of high definition (HD) standards and high dynamic range (HDR).

However, 3-dimensional (3-D) images, videos and audio are gaining increasing popularity which demands correspondingly more efficient encoding and decoding methods in encoders and decoders, namely "codecs," to cope with associated increased quantities of data to be communicated and stored. However, it is highly desirable that encoding methods that provide a degree of data compression should be substantially lossless in relation to information content when generating the compressed data.

Conventional codecs are described in earlier published patent applications and granted patents, for example as provided in Table 2.

TABLE 2

Earlier Publications Describing Codecs

| Earlier patents or patent applications | Details |
|---|---|
| U.S. Pat. No. 5,832,130 | Samsung Electronics Co. Ltd. |
| U.S. Pat. No. 7,379,496 | Microsoft Corp. |
| GB2274754A1 | Samsung Electronics Co. Ltd. |
| U.S. Pat. No. 6,529,634A1 | Thyagarajan |
| U.S. Pat. No. 7,676,101 | Sony Corp. |
| US2006/0204115A1 | Burazerovic: employs a single type of encoding with variable parameters for encoded blocks |

In general, many known video codecs are not able to code efficiently extensive areas of images with substantially constant parameters whilst concurrently being able to encode highly spatially detailed areas of the images. It is customary practice to employ motion compensation in a form of prediction and prediction error coding methods based upon use of transformations, for example discrete cosine transform (DCT) and wavelet transformations. These transformations employ a process wherein portions of a given image, for example a still image or an image forming a part of a video sequence, are divided into blocks which are then subject to encoding processes. The blocks are, for example, 8×8 image elements, 4×4 image elements or similar. Such relatively smaller blocks are employed because larger sizes of blocks result in inefficient encoding processes, although 16×16 image element blocks are sometimes employed. According to contemporary known approaches to image encoding, when multiple different block sizes are used for encoding, it is customary practice to utilize a small variation in block sizes; moreover, block sizes are selected based upon how well movement can be compensated in an associated block area or based upon an encoding quality parameter, for example a target quality parameter. In general, higher encoded image quality requires smaller blocks which results in less data compression. Certain types of contemporary encoding can even result in an increase in data size, when error correction features such as parity codes and error correction codes are included.

From the foregoing, it will be appreciated that providing data compression of images and videos whilst preserving image quality is a contemporary problem which is not adequately addressed by known encoders and decoders, despite a large variety of codecs having been developed during recent decades.

SUMMARY

The embodiments described herein seek to provide an encoder for encoding input data representative of at least one data content item and generating corresponding encoded output data representative of the at least one data content item, wherein the encoded output data is compressed in relation to the input data without any substantial loss of quality occurring during decoding; the data is optionally any type of data, for example at least one of: image data, video data, audio data, graphics data, economic data, mask data, multi-dimensional data (such as 3D), seismographic data, analog-to digital (ADC) converted data, biomedical signal data, genomic data, textural data, text data, calendar data, mathematical data, and binary data, but not limited thereto. It will be appreciated that the data to be encoded can be also pre-processed, encoded or compressed data.

Moreover, the embodiments described herein seek to provide a method of encoding input data representative of at least one data content item and generating corresponding encoded output data representative of the at least one data content item, wherein the encoded output data is compressed in relation to the input data without any substantial loss of quality occurring during encoding.

According to a first aspect, there is provided a method of encoding input data to generate corresponding encoded output data. A method of encoding input data to generate corresponding encoded output data includes the steps of:

(a) processing the input data into a plurality of blocks or packets, the blocks or packets having a size depending upon one or more parameters describing the data content and/or data type of the input data, and the blocks or packets being of one or more sizes;

(b) applying a plurality of mutually different transformations or combinations of transformations to content of the blocks or packets to generate corresponding transformed data;

(c) checking a quality of representation of the transformed data of the blocks or packets compared to the content of the blocks or packets prior to application of the plurality of mutually different transformations or combinations of transformations to determine whether or not the quality of representation of the transformed data satisfies one or more quality criteria;

(d) in an event that the quality of representation of the transformed data of one or more blocks or packets does not satisfy the one or more quality criteria, dividing and/or combining the one or more individual blocks or packets whose quality of representation does not satisfy the one or more criteria further, and repeating step (b) for the one or more blocks or packets whose quality of representation does not satisfy the one or more criteria;

(e) in an event that the quality of representation of the transformed data of the one or more blocks or packets satisfies the one or more quality criteria, selecting one or more coding methods and encoding the data representative of the input data to be encoded to encoded output data: and (f) communicating in the encoded output data, information describing the plurality of mutually different transformations employed when coding the blocks or packets.

The method provides efficient encoding of the input data to provide the corresponding encoded output data whilst potentially providing substantially lossless data compression of the encoded output data relative to the input data to be encoded.

Optionally, the method includes providing the one or more parameters describing the data content and/or data type of the input data in the encoded output data.

Optionally, the method includes providing, for the one or more blocks or packets that does not satisfy the one or more quality criteria, information indicative of dividing and/or combining the one or more individual blocks or packets in the encoded output data.

Optionally, the method includes providing the plurality of mutually different transformations or combinations of transformations within the selection of one or more coding methods in the encoded output data.

Optionally, the method includes using the plurality of mutually different transformations or combinations of transformations to compress content associated with the blocks or packets, so that the encoded output data is smaller in size than the input data to be encoded.

The method includes selecting between mutually different types of transformations for ensuring that the one or more quality criteria are satisfied.

Optionally, the method includes arranging for the one or more quality criteria to be dynamically variable during encoding of the blocks or packets depending upon the one or more parameters describing content included within the blocks or packets.

Optionally, the method is implemented such that the blocks or packets are sub-divided and/or combined so that the content of the blocks or packets described by at least one of representative parameters is flat. That is, transformations produce parameters, and it is beneficial to describe the content with as few parameters as possible. The data content described with at least one representative parameter is, for example, color, amplitude, nucleic acid sequence, strength, number, or code. The at least one or more parameters further relate to at least one of: constant value, sliding parameter value, repetitive pattern.

Optionally, the method is implemented such that the blocks or packets correspond to a series of data, wherein sub-division of the input data corresponding to a given information to form a plurality of corresponding blocks is made dependent upon content present in one or more data preceding the given information within the temporal sequence of data.

Optionally, the method includes adding header information to the transformed data in step (e) to generate the encoded output data, wherein the header information includes information indicative of the plurality of mutually different transformations or combinations of transformations employed in step (b).

Optionally, the method is implemented such that step (b) includes retrieving supplementary information from a database arrangement for use when executing the plurality of mutually different transformations or combinations of transformations, wherein the supplementary information includes at least one of: algorithms, rules, and one or more transformation parameters.

More optionally, the method further includes adding header information to the encoded output data indicative of the database arrangement for enabling subsequent decoding of the encoded output data, in order for the decoder to access the supplementary information when decoding the encoded output data.

Optionally, the method includes employing for the transformations two or more of the following as transform methods used for encoding: a database coding method, a DC-value coding method, slide coding method, scale coding method, line coding method, multilevel coding method (a method disclosed in allowed U.S. Ser. No. 14/058,793 filed by Gurulogic Microsystems Oy, now U.S. Pat. No. 9,245, 353 issued Jan. 6, 2016), interpolation coding method (a method disclosed in WO 2015/007390 A1 and U.S. patent application Ser. No. 14/905,000 filed on Jan. 14, 2016 by Gurulogic Microsystems Oy), extrapolation coding method (a method disclosed in WO 2015007389 A1 and U.S. patent application Ser. No. 14/905,471 filed on Jan. 15, 2016 by Gurulogic Microsystems Oy), unchanged coding method, Discrete Cosine Transform (DCT), pulse code modulation (PCM), Differential Pulse Code Modulation (DPCM), Run-Length Encoding (RLE), SRLE ("Split run-length encoding", a method disclosed in U.S. patent application Ser. No. 13/782,872 filed Mar. 1, 2013, now U.S. Pat. No. 8,823,560 issued Aug. 13, 2014, bzip2-specific RLE, EM ("Entropy Modifier", a method disclosed in U.S. patent application Ser. No. 13/782,757 filed Mar. 1, 2013, now U.S. Pat. No. 8,754,791 issued May 28, 2014, Lempel-Ziv Obehumer (LZO), Variable Length Coding (VLC), Huffman-coding, arithmetic coding, range coding, transform coding, delta coding, ODelta coding (a method disclosed in U.S. patent application Ser. No. 13/782,819 filed Mar. 1, 2013, now U.S. Pat. No. 8,810,439 issued Jul. 30, 2014 DDelta coding method, IDelta coding method, PDelta coding method (methods disclosed in WO 2016/012105 A1 filed by Gurulogic Microsystems Oy on $21^{st}$ of July, 2015), IntraMV coding method, InterMV coding method, color conversion coding method, quantization, wavelet transform, Hadamard transform, linear transform as well as the inverse methods of all mentioned. Other types of transformations are also feasible to employ for the method. It should be noted that optionally, transformation can also mean a combination of different transformations. As an example of such a combination of transformation to be applied is multilevel coding method where mask bits are converted using RLE to parameters and the method is called Multilevel RLE. Sometimes the transformation by default uses several transformations such as in DCT where there is typically also quantization performed, zigzag scanning and using ZRLE for the delivery of parameters.

Optionally, the method includes encoding at least one of video, image, audio, graphics, economic data, mask data, multi-dimensional data (such as 3D), measurement data, text data, texture data, ECG, seismic, analog-to digital (ADC) converted data, biomedical signal data, genomic data, ASCII, Unicode, calendar data, mathematical data and binary information present in the input data.

Optionally, the method includes encoding multiple channels and/or layers in the encoded output data for providing at least one of: interactive video, commercial advertisements, a plurality of viewpoints during sports event reporting, interactive watermarks, interactive pattern recognition, and animated 2D/3D user interface buttons.

Optionally, the method includes providing the encoded data to at least one of following destinations: a data memory device, a communication network, a memory card, data memory disks, local area communication networks (LANs), directly to a decoder.

Optionally, step (a) of the method includes initially splitting the input data into one or more blocks based on at least one of:
(a) image resolutions;
(b) an amount of input data;
(c) a content of input data;
(d) maximum and/or minimum block or packet size;
(e) a quality parameter;
(f) dynamic range of the input data
(g) a variance of the input data; and
(g) whether the input data is divisible into several channels (e.g., multichannel audio or color channels of an image, HDR data, 3D images, videos etc.)

The splitting of input data can also include the division of data into separate channels to be processed, or the data can be processed with combined channels (if the correlation is large, and there are therefore benefits in doing so) in original format (interlaced), or by shifting the data order (progressive-to-interlaced), if the data was originally in planar format.

Optionally, the method includes utilizing only a single processing unit.

Optionally, the method includes utilizing only a single memory device.

Optionally, the method includes setting the one or more parameters to relate to at least one of constant value, sliding parameter value, and repetitive pattern.

According to a second aspect, there is provided a non-transitory computer-readable data storage media including computer instructions which when executed by a processor causes the processor to:
(a) process the input data into a plurality of blocks or packets, the blocks or packets having a size depending upon one or more parameters describing the data content and/or data type of the input data, and the blocks or packets being of one or more sizes;
(b) apply a plurality of mutually different transformations or combinations of transformations to content of the blocks or packets to generate corresponding transformed data;
(c) check a quality of representation of the transformed data of the blocks or packets compared to the content of the blocks or packets prior to application of the plurality of mutually different transformations or combinations of transformations to determine whether or not the quality of representation of the transformed data satisfies one or more quality criteria;
(d) in an event that the quality of representation of the transformed data of one or more blocks or packets does not satisfy the one or more quality criteria, to divide and/or combine the one or more individual blocks or packets whose quality of representation does not satisfy the one or more criteria further and to repeat step (b) for the one or more blocks or packets whose quality of representation does not satisfy the one or more criteria;
(e) in an event that the quality of representation of the transformed data of the one or more blocks or packets satisfies the one or more quality criteria, to select one or more coding methods and to encode the data representative of the input data to be encoded to encoded output data; and
(f) communicate in the encoded output data information describing the plurality of mutually different transformations or combinations of transformations employed when coding the blocks or packets.

According to a third aspect, there is provided an encoder operable to encode input data to generate corresponding encoded output data, including data processing hardware which is operable:
(a) to process the input data into a plurality of blocks or packets, the blocks or packets having a size depending upon one or more parameters describing the data content and/or data type, and the blocks or packets being of one or more sizes;
(b) to apply a plurality of mutually different transformations or combinations of transformations to content of the blocks or packets to generate corresponding transformed data;
(c) to check a quality of representation of the transformed data of the blocks or packets compared to the content of the blocks or packets prior to application of the plurality of mutually different transformations or combinations of transformations to determine whether or not the quality of representation of the transformed data satisfies one or more quality criteria;

(d) in an event that the quality of representation of the transformed data of one or more blocks or packets does not satisfy the one or more quality criteria, to sub-divide and/or to combine the one or more individual blocks or packets whose quality of representation does not satisfy the one or more criteria further and repeating step (b) for the one or more blocks or packets whose quality of representation does not satisfy the one or more criteria;

(e) in an event that the quality of representation of the transformed data of the one or more blocks or packets satisfies the one or more quality criteria, to select one or more coding methods and encode the data representative of the input data to be encoded to encoded output data; and (f) to communicate in the encoded output data information describing the plurality of mutually different transformations or combinations of transfomations employed when coding the blocks or packets.

Optionally, the encoder is implemented such that the data processing hardware is implemented using computing hardware operable to execute a software product. More optionally, the data processing hardware includes a plurality of processors which are operable to process data in parallel, and the encoder is operable to direct concurrently block and/or packet data to the plurality of processors for encoding to data to be included in the encoded output data.

It is to be noted that the possibility to use plurality of processors is different from the issue of processing unit. Namely, the encoder pursuant to the invention has only one processing unit as opposed to many prior art solutions which have two separate processing units (analysis unit and encoder), and thus also a plurality of memories. The method pursuant to this invention is a completely independent method and integrated solution which transmits parameters to the decoder at once, without the need for a preliminary pre-processing unit (i.e., not first from some analysis part to the encoder, and then to the decoder but analysis and encoding part functioning as one entity). The integrated solution also enables optimizing of memory bandwidth and memory capacity, because the input data needs to be transferred to the encoder only once, as opposed to a 2-part solution used by the prior art methods where the analysis processor and encoder receive their data separately from the image source. In the 2-part prior art solutions, both the analysis part and the encoder have their own memories where the input data is stored, whereas the integrated solution pursuant to the invention only requires one memory which leads to significant savings in both memory bandwidth and memory capacity.

The encoder is operable to select between different types of transformations for ensuring that the one or more quality criteria are satisfied.

Optionally, the encoder is operable to use the plurality of mutually different transformations or combinations of transformations to compress content associated with the blocks or packets, so that the encoded output data is smaller in size than the input data to be encoded.

Optionally, the encoder is operable to arrange for the one or more quality criteria to be dynamically variable during encoding of the blocks or packets depending upon the one or more parameters describing content included within the blocks or packets.

Optionally, the encoder is operable to sub-divide and/or combine the blocks or packets so that the content of the blocks or packets described by at least one of representative parameters is substantially flat. More optionally, the encoder is implemented such that the data content described with at least one representative parameter corresponds to, for example, a color, amplitude, nucleic acid sequence, strength, number, or code. The at least one or more parameters further relate to at least one of: constant value, sliding parameter value, repetitive pattern.

Optionally, the encoder is implemented such that the blocks or packets correspond to a series of data, wherein sub-division of the input data corresponding to a given information to form the plurality of corresponding blocks is made dependent upon content present in one or more data preceding the given information within the temporal sequence of data.

Optionally, the encoder is operable to add header information to the transformed data to generate the encoded output data, wherein the header information includes information indicative of the plurality of mutually different transformations or combinations of transformations employed by the encoder.

Optionally, the encoder is operable to retrieve supplementary information from a database arrangement for use when executing the plurality of mutually different transformations or combinations of transformations, wherein the supplementary information includes at least one of: algorithms, rules, and one or more transformation parameters.

More optionally, the encoder is operable to add header information to the encoded output data in a manner indicative of the database arrangement for enabling subsequent decoding of the encoded output data, in order for the decoder to access the supplementary information when decoding the encoded output data.

Optionally, the encoder is operable to employ for the transformations two or more of: a data base coding method, a DC-value coding method, slide coding method, scale coding method, line coding method, multilevel coding method, unchanged coding method, interpolation coding method, extrapolation coding method, DCT, pulse code modulation (PCM), DPCM, RLE, SRLE, bzip2-specific RLE, EM, LZO, VLC, Huffman-coding, arithmetic coding, range coding, transform coding, delta coding method, ODelta coding method, DDelta coding method, IDelta coding method, PDelta coding method, IntraMV coding method, InterMV coding method, color conversion coding method, quantization, wavelet transform, Hadamard transform, linear transform as well as the inverse methods of all mentioned. Other types of transformations as well as combinations of different transformation methods are optionally employed by the encoder.

Optionally, the encoder is operable to encode at least one of video, image, audio, graphics, economic data, mask data, multi-dimensional data (such as 3D), measurement data, text data, texture data, Electrocardiogram (ECG) data, analog-to digital (ADC) converted data, biomedical signal data, genomic data, seismic, ASCII, Unicode, and binary information present in the input data to be encoded.

Optionally, the encoder is implemented to transmit the encoded data to at least one of following destinations: a data memory device, a communication network, a memory card, data memory disks, local area communication networks (LANs), directly to a decoder.

Optionally, the encoder includes a single processing unit.

Optionally, the encoder includes a single memory device.

Optionally, the encoder is implemented such that the one or more parameters further relate to at least one of constant value, sliding parameter value, and repetitive pattern.

Optionally, the encoder is operable to provide the one or more parameters describing the data content and/or data type of the input data in the encoded output data.

Optionally, the encoder is operable to provide, for the one or more blocks or packets that does not satisfy the one or more quality criteria, information indicative of dividing and/or combining the one or more individual blocks or packets in the encoded output data.

Optionally, the encoder is operable to provide the plurality of mutually different transformations or combinations of transformations within the selection of one or more coding methods in the encoded output data.

It will be appreciated that features of the invention are susceptible to being combined in various combinations without departing from the scope of the invention as defined by the appended claims.

BRIEF DESCRIPTION OF THE DRAWINGS

Embodiments of the present disclosure will now be described, by way of example only, with reference to the following diagrams wherein.

Figure 1:
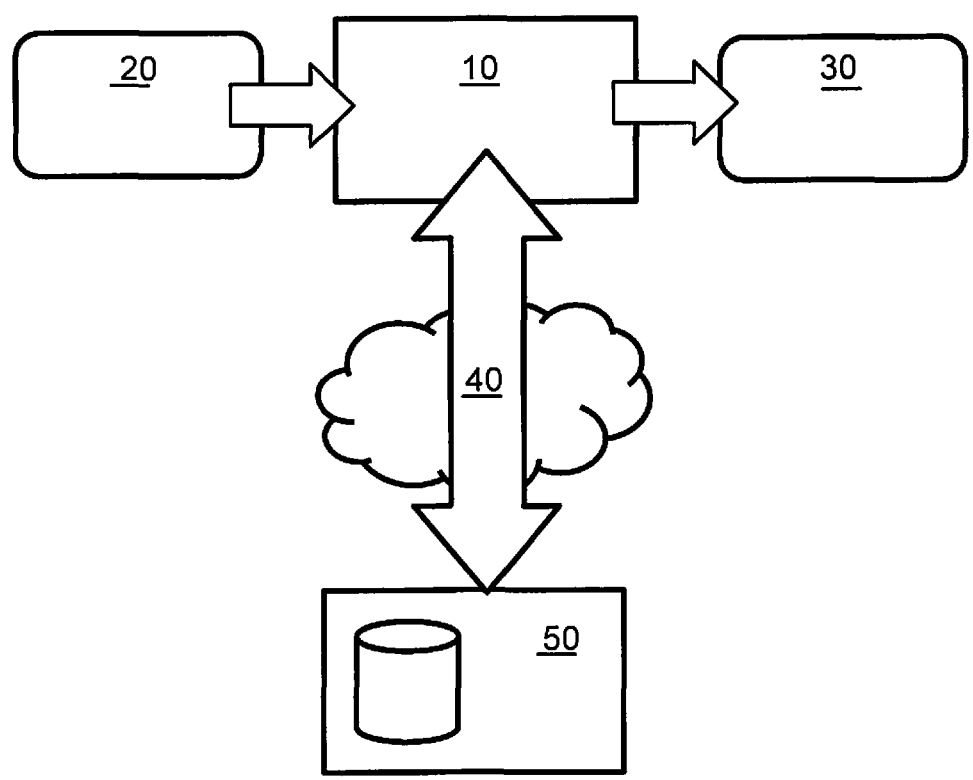
FIG. 1 is a schematic illustration of an embodiment of an encoder.

In the accompanying diagrams, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION

In overview, the embodiments are concerned with encoders and associated methods of encoding input data to generate corresponding encoded output data. The methods are concerned with receiving input data representative of e.g. one or more images and/or one or more audio signals, and then processing the input data in a manner corresponding to at least one of:

(a) partitioning each image into blocks which can be of variable size;

(b) partitioning the one or more audio signals into packets which can be of variable size;

(c) sub-dividing and/or combining blocks of images to form smaller and/or larger blocks which can be of variable size which are more favorable to encode; and (d) sub-dividing and/or combining packets of one or more audio signals to form divided and/or combined packets which are more favorable to encode.

Moreover, the method includes processing the blocks and/or packets to generate compressed encoded output data representative of the one or more images and/or the one or more audio signals or other type of input data.

The method is capable of employing multiple coding and entropy modifying methods, containing transformations, when coding and compressing data describing blocks of data. Different coding methods can be used for different blocks of a given image, when favorable coding and compression performance is thereby achieved, depending upon information content of the different blocks. As there can be different coding methods applied to blocks or packets of same size, there needs to be the selection of a coding method communicated in the encoded output data. Further, same coding method can be applied to blocks or packets of different size. Optionally, RD optimization is employed as a quality criterion when processing the blocks of data. RD optimization will be described in greater detail below.

Information regarding the splitting/combining data blocks or packets is communicated with the data, either in header or in the encoded output data. The information can contain bits to express individual splitting/combining decisions. Further, because the split/combine decisions enable segmentation, which defines the area identifiers for the blocks (i.e. the size, location and shape of each block), then this information can also be conveyed and transmitted e.g. with x and y coordinates, which would specify the sizes and locations of the blocks (and maybe even their shapes). When using x and y coordinates to transmit the split/combine information, it would be beneficial to delta code those x and y coordinate values separately. It will be appreciated that in addition to the aforementioned examples, there are also other ways to convey and transmit the size, location and shape of each block, gained from the split/combine decisions.

Information describing the plurality of transformations employed when coding the blocks/packets is communicated in the encoded output data; this information is either included in the encoded output data, or the output data includes a reference to one or more databases from where information describing the transformations utilized can be obtained. Coding methods that are employed can include one or more of multilevel coding method, line coding method, scale coding method, slide coding method, interpolation coding method, extrapolation coding method, unchanged coding, IntraMV coding method, InterMV coding method, SRLE, EM, Odelta and range coding, as will be elucidated in greater detail below. Optionally, splitting (namely sub-dividing) or combining Init-blocks is also employed. This can be done separately for each channel or for multiple or all channels simultaneously.

Selection of the sizes of the blocks is determined by an ease with which areas corresponding to the blocks can be encoded; for example, larger blocks are employed for areas of the one or more images which can be described with relatively few associated parameter values, namely the areas are substantially flat after the transformation, and smaller blocks are employed for areas of the one or more images which are difficult to encode on account of relatively abrupt spatial changes therein, thus requiring a larger amount of associated parameter values. It should be appreciated that the term "flat" means that the area in question is easily encoded, namely only a few bits are produced after the coding method has been applied. That is, after the transformation there are only a few parameters or no parameters at all.

The parameters optionally pertain to one or more of: constant value, sliding values, repetitive pattern, but are not limited thereto. Easy encoding corresponds, for example, to at least one parameter associated with a given area being substantially constant within the given area. Moreover, the method also employs larger blocks for stationary areas in video sequences of images, or to groups of areas in the video sequences of images that are moving similarly, namely blocks which correspond to fixed objects. The blocks are optionally rectilinear in relation to areas of the one or more images which they represent, for example 64×64 elements, 32×16 elements, 4×20 elements, 10×4 elements, 1×4 elements, 3×1 elements, 8×8 elements, 1×1 element and so forth; optionally, the elements correspond to pixels present in the one or more images, but can be subject to scaling operations during encoding, namely each element corresponding to a corresponding plurality of pixels. However, other shapes of blocks are optionally employed, for example elliptical blocks, circular blocks, triangles and so forth. Moreover, by analogy, the method can also be applied to encode one or more audio signals, wherein the one or more audio signals are subdivided into packets, and/or combined into packets, of variable temporal length, depending upon a nature of the audio signals corresponding thereto, and the packets are then encoded to generate encoded compressed output data; the packets are synonymous with aforesaid blocks but pertain to audio rather than image information. Encoders pursuant to the present invention are capable of concurrently encoding both audio information and image information as well as any other type of data.

The degree of variation in the content of data can be measured by calculating e.g. the variance, the standard deviation, maximal and minimal values of amplitude, etc. If for example the variance is used as the meter, then it is beneficial to first divide the data in such a fashion that the less variation there is in the data and therefore the smaller the variance value is, the larger the resulting blocks should be. Vice versa, with more variance, i.e. with a lot of variation in the content, it is beneficial to divide data to smaller blocks. This can also be performed so that at first, data is divided into larger blocks, after which those blocks will be analysed further. In case there is lot of variance in the content of some of the large blocks, then those large blocks will be divided to smaller blocks based on variance in the content. However, this division always needs to be communicated from the encoder to the decoder, so that the decoder knows what was e.g. the standard deviation before decoding the data.

However, it is much more effective to divide the data already in the very beginning to smaller blocks and then to start combining them than to start with larger blocks and then to continue to divide them to smaller and smaller blocks, as it is probable that some splitting, namely subdividing, of blocks into smaller blocks will take place later anyway. Also, the quality parameter can have an effect on the initial division, that is, the better quality result is to be gained, the smaller initial blocks it is worth creating and vice versa.

During processing of the areas of the one or more images, for example, into corresponding blocks, the method includes checking a quality of representation of information provided by the blocks relative to corresponding detail in the one or more images to compute a corresponding quality index; in an event that the computed quality index indicates, when compared against a reference quality threshold, that a selection of block sizes has been employed such that the quality of representation of data provided by the blocks is insufficient, the method iterates back and uses progressively smaller blocks, and/or combines various blocks together, if it improves the compression efficiency and does not deteriorate the reconstruction significantly, until the quality index indicates that the quality of representation is met as defined by the reference quality threshold. By such an approach, it is feasible, pursuant to the present invention, to achieve data compression during encoding which is substantially lossless, depending upon the choice of a threshold value for the quality of representation of information. Optionally, the reference quality threshold is made dynamically variable, depending upon content present in the one or more images; for example, when the one or more images are a part of video sequence where there is rapid chaotic activity, the reference quality threshold can be relaxed during the chaotic activity for enabling an enhanced degree of data compression to be achieved. The chaotic activity can be, for example, random features such as flowing turbulent water, flames, falling snow, billowing smoke, ocean waves and so forth, wherein loss of information is not readily discernible when the encoded data is subsequently decoded in a decoder.

In the following, a practical example for applying the method to data containing a repetitive pattern is described with help of a checkered chess board pattern that has a spatial periodicity. There are repetitive patterns of, for example, black and white squares next to each other. Thus, the pattern can be tested for coding efficiency and then it is known which transformation makes the parameter constant, namely the respective area substantially flat. What is desired is that the parameter will be constant in the end, namely there are relatively few of them, after a sufficient amount of iterations based on the quality representation.

If each of the squares of a chess board would have the size of 16×16 pixels, i.e. the entire board would be an image with the dimensions 128 pixels*128 pixels, in such a case the splitting of blocks would continue, using for example the DC transformation, until the size of each of the blocks would be 16×16 pixels, namely one block would always represent one square of a chess board. Thus, the contents of such a block would be flat after the DC transformation, and therefore it could be represented by a single DC parameter value.

In case the SlideNN method (transformation) would also be available and used, the SlideNN method being a transformation which in decoding would use a nearest neighbor interpolation based on the values of the vertices to construct the contents of the block, then the splitting would continue only until blocks with size 32×32 pixels, because this type of SlideNN transformation is able to represent the information of a block only with 4 parameters, i.e. the values at the vertices. Thus, the representation would have values corresponding to light (L) and dark (D) squares in the order L D D L. It should also be noted that there are several versions of the Slide method available, e.g. SlideLinear and Slide-BiCubic. Those methods use better interpolators for producing the correct sliding block, and those methods would not be selected in the case of this example, because they would not produce the right decoded output. That is, if SlideLinear or SlideBiCubic were used, the quality criteria for the block in question would probably not be met with these transformations, but instead the block would have to be split further or some other transformation would be needed to be applied.

Furthermore, it should also be noted that when the first 32×32 block has been encoded using the SlideNN method, then the corresponding SlideNN method can be used for the next block on the right side as it is exactly the same and repeating. Alternatively, if there is a method available such as CopyLeft transformation, then it can be used. The CopyLeft method has the advantage that it needs no parameters at all, because during the decoding, an equal-sized block from the left side of the block in question is copied to present it, including the block contents. Other versions of the CopyLeft transformation include CopyUpper and CopyXY, the first of which neither needs parameters but instead copies directly from above the current block and the second of which needs only two parameters X and Y based on which it fetches the content for the current block. Thus, the repeating patterns after applying the CopyLeft transformation is flat, and in this particular case it would produce with the least amount of parameters a result that is of good quality. Therefore, in the case of the CopyLeft transformation, the block is flat and it can thus be encoded with efficiency.

When several blocks have been coded already for example using the Slide and/or the CopyLeft method, then those coded blocks can be utilized in later sections of the image better. For example, a 64×64 block that has been found to be flat e.g. after CopyUpper or the CopyLeft transformations have been applied, then there is no longer a need to split the block further even into the 32×32 blocks.

It should be noted that a repeating pattern may be a lot more complicated, such as a repeating pattern of apples in an image. For example, if one apple has already been encoded as very small slices, namely blocks, or as one block using a transformation that requires a lot of parameters, then the next similar apple can be made to be flat by using the CopyLeft/CopyUpper/CopyXY or by database transformations, which means that it can be coded considerably more beneficially as regards a used bit count than was the case when the first apple was coded. Indeed, certain methods such as DCT/multilevel coding method/database coding method are often able to transform the information contained in a block into a very beneficial form, namely flat. Therefore, it might be beneficial to code the first apple with one or some of those methods without having to continue the block division up until very small blocks.

For example, the multilevel coding method (i.e. transformation) would be able to code the exemplary chess board as one 128×128 block that would contain only two values and where the bit mask of the values and the values of the levels would be delivered as transformation parameters. If such a method were available in the example case, then it should be analysed already when making the decision on splitting the 128×128 block, using an RD value based on quality criteria, whether the multilevel method should be used for that large 128×128 block or whether it would be more beneficial to split the block into slightly smaller blocks, and then code them using one or more different methods, in order to possibly achieve a better end result as regards quality criteria, e.g. the RD value.

Determination of the size of the blocks in the aforesaid encoder can be optionally based upon one or more criteria as listed in Table 3.

TABLE 3

Criteria for split selection and/or combining selection of blocks during encoding

| Criterion number | Criterion |
|---|---|
| 1 | Variance or standard deviation of block data as derived from a corresponding area of an input image |
| 2 | Mean or sum of an absolute difference between data represented by a given block and a prediction of its value |
| 3 | Variance or standard deviation of an absolute difference between data represented by a given block and a prediction of its value |
| 4 | Transformations used by the selected coding methods |
| 5 | Estimated bit amount that the coding method would produce |
| 6 | Estimated decoding distortion that coding method would produce |
| 7 | Estimated RD value based on the decoding distortion and the bits that the coding method would produce |
| 8 | Estimated RD value of the coding method compared to that of the other coding methods with the blocks of same size |
| 9 | Estimated RD value of the coding method compared to that of the other coding methods with the blocks of different size |

Optionally, predictions in Table 3 are based upon known rules employed when encoding data, for example, one or more images. Alternatively, the predictions in Table 3 are based upon provided configuration information, for example as provided from selected database references, from prediction directions, from movements of block coordinates within the one or more images, and so forth. A use of a variance or a standard deviation is an approach employed pursuant to the present invention to provide compression of information by describing a mutual relationship of elements included within a given corresponding block. In many situations, predictions of block data with associated encoding is itself sufficient when performing encoding pursuant to the present invention, but it is optionally desirable to include code prediction error data within the prediction to improve an accuracy of the prediction. In a simple embodiment of the present invention, a simple data prediction method is employed, for example a mean value, namely "DC" value, of pixels or elements within a given block are to be delivered in the encoded output data.

Splitting areas, alternatively combining areas, of one or more images, for example, provided as input data to an encoder implementing the aforesaid method is optionally implemented according to any manner which provides both compression and also substantially maintains image quality, namely is substantially lossless during encoding. The method applies various strategies to such splitting and/or combining of areas. For example, if a given block includes considerable information, it is optionally split into a plurality of corresponding smaller blocks that are relatively "flat", alternatively optionally combined into larger blocks that are relatively "flat", namely substantially constant, in relation to their content such that they individually include relatively little information. When the encoding method pursuant to the present invention is applied to at least one or more images and/or one or more audio signals, encoding quality and encoding noise in the encoded output data are optionally employed to control a manner in which splitting up of input images and audio input signals into blocks and packets respectively occurs. However, it will be appreciated that other types of data content items can be processed in a similar manner, for example, at least one of: image data, video data, audio data, graphics data, economic data, mask data, multidimensional data (such as 3D), measurement data, seismographic data, analog-to-digital (ADC) converted data, biomedical signal data, genomic data, text data, textural data, calendar data, mathematical data, and binary data, but not limited thereto.

It will be appreciated that the actual splitting or combining can take place in various forms and directions, such as diagonally, horizontally, vertically, etc. As a result of splitting or combining, 1 . . . N sub-blocks are created. The resulting sub-blocks can be of the same or of different size. Furthermore, the sub-blocks can be of the same shape or of different shape. The size or shape does not matter as long as the encoder and the decoder can function in a similar way, with or without related additional information transmitted to them.

Optionally, the noise in the encoded output data is based on at least one of:
(i) noise present in a present block or packet;
(ii) noise present in one or more previous blocks or packets generated by the method; and
(iii) previous images.

Optionally, when a given input image is split into areas and corresponding blocks, the method analyses the blocks thereby generated to determine whether or not any of the blocks can be combined together, as aforementioned, subject to aforesaid quality criteria, in order to obtain a greater degree of data compression in the encoded output data. In the foregoing, the encoded output data includes information associated with the blocks which defines locations of their corresponding areas in their original images in the input data to be encoded.

When encoding the one or more images present in the input data to be encoded using the method, data associated with the input images can be either quantized or down-sampled so as to achieve compression benefits. Quantization reduces the dynamic range of the samples (or the transformation values), and it is executed for every sample (or transformation value) separately, whereas down-sampling refers to decreasing the sampling rate, i.e., less samples are taken from a block of data. These methods are therefore related, but not the same.

For example, the data can be down-sampled in ratios of 2×1:1, 2×2:1, 1×2:1, 4×1:1, or similarly quantized prior to being subject to aforementioned encoding methods. Optionally, such down-sampling or quantizing is performed in response to a desired quality of encoding in the compressed encoded output data generated by applying methods pursuant to the present invention. Optionally, larger blocks processed by the methods are less down-sampled or quantized than smaller blocks; in other words, a degree of quantization or down-sampling employed is optionally decreased as block sizes are increased. Optionally, during encoding, a scaling factor for down-sampling or quantization employed, is made dynamically variable, for example in response to a nature of the content in a sequence of images, for example video, to be encoded.

During encoding of blocks pursuant to the method, each block has various representative parameters which describe its contents. These parameters are conveyed when encoding via various "channels". For example, color channels describing blocks of an image can include one or more of: black/white (B/W), Y, U, V, red (R), green (G), blue (B), Cyan (C), Magenta (M), Y and K. Moreover, the input images for encoding and the blocks can be optionally processed when executing the methods using a variety of potential color or pixels formats, for example Y, YUV420, YUV422, YUV444, RGB444, G and CMYK contemporary standards and formats. Moreover, the format is optionally planar, interleaved line planar and so forth. Moreover, the methods of the invention are capable to change format of images and/or blocks as well as to combine or separate channels when performing encoding activities; for example, an original image is in an interleaved RGB format and is encoded using methods pursuant to the disclosure to generate encoded output data in YUV420 format or vice versa. It will be appreciated that changing the format and combining or separating channels can be performed also for audio data, as well as for other types of data.

Bit depth, namely dynamic range of a pixel when implementing the aforesaid encoding method, can be in a range of 1-bit to 64-bit resolution. Optionally, different pixel color or audio channels can be encoded with mutually different resolutions, provided that encoding quality criteria and compression performance of the encoding methods is satisfied.

The encoding methods pursuant to the present disclosure are optionally implemented using encoding parameters and encoding rules and/or tables which are stored on a database and which are accessed when performing encoding activities. Optionally, the database is created during the encoding process and delivered for use when implementing the method via an encoder. For example, motion compensation during encoding can be implemented using delivered databases of information to the encoder. The encoder is operable to encode original pixel information present in the input data and/or encode prediction error information. Using database information when encoding input data to generate corresponding encoded output data enables the encoder to adapt to revisions in encoding standards of parameters, tables and similar utilized for encoding. Coding approaches which can be adopted when implementing the encoding methods pursuant to the present invention optionally include two or more methods of: data base coding, DC-value coding, slide coding, scale coding, line coding, multilevel coding, unchanged coding, interpolation coding method, extrapolation coding method, DCT coding, pulse code modulation (PCM), DPCM, RLE, SRLE, EM, LZO, VLC, Huffman-coding, arithmetic coding, range coding, transform coding, delta coding, ODelta coding, DDelta coding, IDelta coding, PDelta coding, bzip2-specific RLE, IntraMV coding method, InterMV coding method, color conversion coding method, quantization, wavelet transform, Hadamard transform, linear transform and inverse methods of all mentioned but not limited thereto. Optionally, the coding approaches including any combination of aforementioned examples of coding methods, namely a plurality of encoding transformations are beneficially employed, as well as a plurality of parameters, for blocks and/or packets, depending upon information content of the blocks and/or packets. When a coding approach such as Huffman encoding is employed, such coding utilizes fixed tables of encoding parameters or delivered tables of coding parameters. The encoder is implemented using computing hardware having data storage arrangements, wherein optimized tables of encoding parameters can be stored in the data storage arrangements for future use when performing encoding operations. Reference addresses for enabling a decoder to access databases for obtaining suitable parameters for decoding the encoded output data from the encoder are included in the encoded output data. Optionally, the databases are accessible via a communication network, for example via the Internet. Optionally, the databases are supported via cloud computing arrangements. When the method implemented in the encoder utilizes mathematically generated databases, the databases can optionally be DC value, 1D/2D-linear transition, 1D/2D-curved transition, a 1D/2D transformation function or some known image block or audio packet structure.

The method of encoding pursuant to the present disclosure when executed on an encoder is operable to encode input data to generate encoded output data, wherein the encoded output data can be output as a bit stream, alternatively stored in data storage media, for example, as a data file. Moreover, the method of the present disclosure is capable of being utilized in a range of possible applications; beneficially, a header for video, image, image block, audio or audio packets which includes supplementary information, such as version number, size of data for the video, image or packet, quality factor threshold employed when encoding, maximum and/or minimum block or packet size, encoding approaches applied, namely types of transformations employed, tables of encoding parameters, and any other information for assisting subsequent decoding processes. Optionally, information that does not vary between blocks is not included for obtaining an enhanced degree of data compression in the encoded output data, or is included at a higher level in the encoded output data, for example at a header or a sub-header level. Table 4 provides a hierarchical order of levels which can be employed in the encoded output data generated by the encoder.

TABLE 4

Order of levels in encoded output data, from high to low

| Level order | Information associated with level |
| --- | --- |
| High | Video |
|  | Groups of images |
|  | Image |
|  | Groups of macro blocks |
| Medium | Macro blocks |
|  | Groups of blocks |
|  | Block |
|  | Groups of microblocks |
| Low | Microblocks |

Optionally, the method of encoding pursuant to the present disclosure is operable when executed to select and to deliver information pertaining to one or more levels in the encoded output data, for example, dependent upon a field of application of the method, for example consumer video products, professional image compression apparatus for survey use, X-ray imaging apparatus, and magnetic resonance imaging (MRA) apparatus. Similar considerations pertain to orders of levels in encoded output data when the method pursuant to the present invention is employed to encode audio data; there can be employed headers for audio, groups of packets, packets, sub-packets, groups of waveform segments, and waveform segment.

It should be appreciated that the method has been designed to encode data in such a way that it is given to the method, i.e. with the given parameters. However, nothing prevents using the sub-methods of the main method, i.e. the transformations, to format and encode the data in several phases iteratively, in such a way that as a result of some sub-method/transformation the generated residual shrinks smaller and smaller by each iteration, and may even vanish. However, it would be advantageous if every block could be processed with one single sub-method/transformation, in which case there should be a sufficient amount of different sub-methods/transformations available, in order to avoid re-transforming the residual.

it should be appreciated that the input data can be original data, pre-processed data or residual data, but the method produces only the encoded output data. This encoded data can later be decoded into a similar format as the input data given to the encoder was. Therefore, if the given input data was already processed data or residual data, then the possibly needed counter-operations are no longer the responsibility of the method, but of the system using the method. In other words, the method was primarily developed to implement the entire coding solution, and therefore, beneficially, the given input data is original data, and not for example prediction error generated by motion estimation or intra-prediction, for some data block. Motion estimation (namely InterMV coding method) or intra-prediction (namely IntraMV coding method) could be used as a sub-method/transformation in this method, but in such a case, it would be beneficial if they would not yield a significant residual, so that their residual would not have to be re-transformed, with new transformations.

Referring to FIG. 1, there is shown an illustration of an encoder pursuant to the present disclosure. The encoder is denoted by 10 and is operable to receive input data 20 and to encode the input data 20 by employing an encoding method pursuant to the present disclosure to generate corresponding encoded compressed output data 30. The output data 30 is encoded in a substantially lossless manner as aforementioned. Optionally, the encoder 10 is coupled via a communication network 40 to a database arrangement 50 whereat one or more parameters, tables and/or rules for encoding the input data 20 are stored.

In operation, the encoder 10 receives the input data 20, optionally derives encoding information from the database arrangement 50 via the communication network 40, and then proceeds to encode the input data 20 to generate the encoded compressed output data 30. Optionally, the input data 20 includes at least one of: audio, one or more images, video, graphics, economic data, mask data, multidimensional data (such as 3D), text, texture, multidimensional data, ECG, biometric data, genomic data, seismic, measurement data, ASCII, Unicode, and binary data but is not limited thereto. Optionally, the encoded output data 30 includes headers, encoding information as well as encoded data. The output data 30 can be streamed from the encoder 10, for example for communication via a communication network arrangement to one or more data storage devices or decoders, or stored directly onto machine-readable data storage media, for example server hard drive disk storage, portable solid-state memory devices and so forth.

The encoder 10 can be implemented as hardware, for example via one or more PGLA (Programmable Gate Logic Array), via one or more software applications executable upon computing hardware, or any mixture of hardware and software, for example a parallel processing engine. The encoder 10 can be employed in multimedia products, computers, mobile telephones ("cell phones"), Internet services, video recorders, video players, communication apparatus and similar devices. The encoder 10 is optionally employed in conjunction with image capture systems, for example surveillance cameras, hospital X-ray systems, hospital MRI scanners, hospital ultrasound scanners, aerial surveillance systems and similar apparatus which generate large quantities of image data wherein lossless compression is desired so as to preserve fine information in the images whilst rendering the quantities of image data manageable for data storage purposes.

The encoder 10 can be used with known apparatus for image processing, for example in conjunction with an image/video processor as described in U.S. Pat. No. 8,169,547 and in U.S. Pat. No. 9,225,989 as well as in U.S. Pat. No. 9,232,282 herewith incorporated by reference in its entirety, for example in conjunction with an image generator as described in U.S. Pat. No. 8,649,427 herewith incorporated by reference in its entirety, and for example with a pattern recognizer as described in U.S. Pat. No. 8,615,137 herewith incorporated by reference in its entirety.

Figure 2:
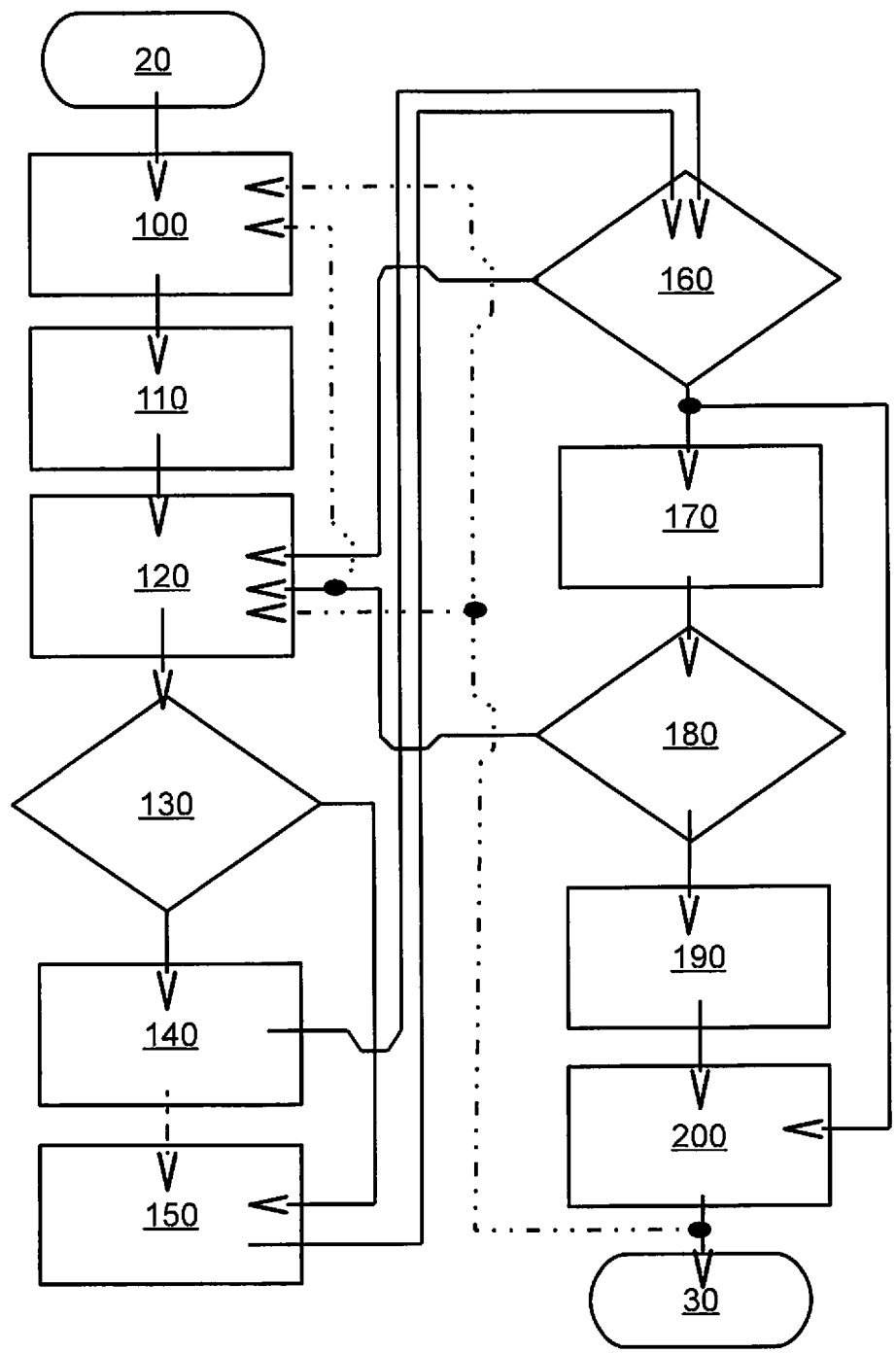
FIG. 2 is a flow chart of steps of a method of encoding input data representative of at least one data content item to generate corresponding encoded output data, wherein the encoded output data is compressed relative to the input data without substantial loss of quality occurring during encoding; the data content item can include at least one of: image data, video data, audio data, graphics data, multidimensional data (such as 3D), economic data, mask data, measurement data seismographic data, analog-to-digital (ADC) converted data, biomedical signal data, genomic data, text data, textural data, calendar data, mathematical data, and binary data, but not limited thereto.

A method of encoding input data using the encoder 10 of FIG. 1 will now be described with reference to FIG. 2. In FIG. 2, steps of a method of encoding input data 20 are denoted by 100 to 200. In a first step 100, the method includes receiving input data for blocks/packets, such as image, video and/or audio, but not limited thereto, for example for receiving the aforesaid input data 20; block/packet type, block/packet content and format information is derived at the first step for inclusion in the encoded output data 30. The first step 100 is capable of providing writing header information, for example data block size information, into the encoded compressed data.

In a second step 110, executed after the first step 100, the method includes creating, if needed, initial blocks or packets. In a third step 120, executed after the second step 110, the method includes performing an analysis of block and/or packet information generated by the second step 110. This analysis contains estimating the bits used and quality produced by different coding methods. Typically, this selection is made based on a RD quality value. In order to estimate as accurate a quality value (such as the RD value) as possible, this step usually also includes estimating or actually performing the inverse coding, namely decoding, of the data. When estimating a quality value in this way, there is no need to finish the coding; instead, it is enough to make estimates on the bits that the methods use and on the quality that they will produce. However, the actual selection is usually made based on the RD value, and the better the estimates are, the better the end result will be. The transformations and methods can be executed for as long as necessary, so that the estimates will be good enough for making a decision. Additionally, the analysis section may utilize the transformations and methods of the coding section in making splitting decisions, without having to move data from one memory to another, or without having to finish the encoding task, which will be executed after the selections for block methods have been made.

In a fourth step 130, executed after the third step 120, the method includes determining whether or not one or more blocks and/or packets identified in the third step 120 need to be split and/or combined, for example for achieving a defined quality of encoding and/or defined compression ratio, namely substantially lossless encoding. In an event that one or more blocks or packets are required to be split and/or combined in the fourth step 130, the method proceeds to a fifth step 140 in which the one or more identified blocks or packets are split into smaller blocks or packets, alternatively combined into larger blocks or packets, thereby creating additional new blocks or new packets. In an event that one or more blocks or packets are not required to be split and/or combined in the fourth step 130, the method proceeds directly to a sixth step 150. On completing the fifth step 140, when appropriate, the method also proceeds to the sixth step 150.

In the sixth step 150 the data of the blocks reconstructed by the transformations based on the analysis executed in the step 120 is output to data streams. Further in step 150, appropriate coding method(s) for the blocks or packets are selected. It should be appreciated that the parameters produced already at an earlier phase when applying transformations can be utilized in the encoding of the data. That is, it is not worth losing them during the process. After this the method proceeds further to a seventh step 160.

In the seventh step 160, the method includes determining whether or not a last block or packet has been reached which is to be encoded. In an event that there are blocks or packets remaining to be encoded, the method includes returning back to the third step 120 of performing the analysis of block or packet information. In an event that all the blocks or packets have been encoded, the method proceeds to an eighth step 170. The eighth step 170 of the method includes compressing and entropy-encoding data, for example pixel values, parameters and split information, for example using RLE, Huffman, DCT or similar transformations, and writing header information as aforementioned; for example, if DC values of the blocks are sent, they can be firstly optionally delta-encoded, and thereafter corresponding delta-encoded values encoded as RLE and then encoded using Huffman encoding.

When compression and encoding activities in the eighth step 170 have been completed, the method proceeds to a ninth step 180 which checks whether or not a last initial block, packet or frame has been reached. In an event that the last initial block, packet or frame has not been reached, the method returns to the third step 120. In an event that the last initial block, packet or frame has been reached, the method proceeds to a tenth step 190. In the tenth step 190, the method performs one or more analyses whether or not blocks/packets are, for example, similar to previous blocks/packets or, for example in the case of images, black in color. Such analysis optionally also needs some information that can be obtained from one or more of the previous steps. This step enables blocks/packets of the encoded output data to be more compressed and it also possibly enables the duplication of identical blocks/packets. Similar analysis that does not need any information from one or more of the previous steps are also executed already in the third step 120, and then it is also possible to avoid unnecessary processing to be executed in the processor. After completing the tenth step 190, the method proceeds to an eleventh step 200, wherein the method applies end encoding of blocks or packets, to finalize the encoded compressed output data 30, namely assembling the encoded blocks or packets to generate the total encoded output data. Optionally, the method progresses from the seventh step 160 directly to the eleventh step 200 if applicable, for example in case only one block needs to be encoded and it is, for example, in case of an image, black or similar to the previous block in the previous image. All of the encoded data that can be written to a file or streamed out is beneficially generated as early as possible to avoid extra buffering when implementing the method.

Figure 3A:
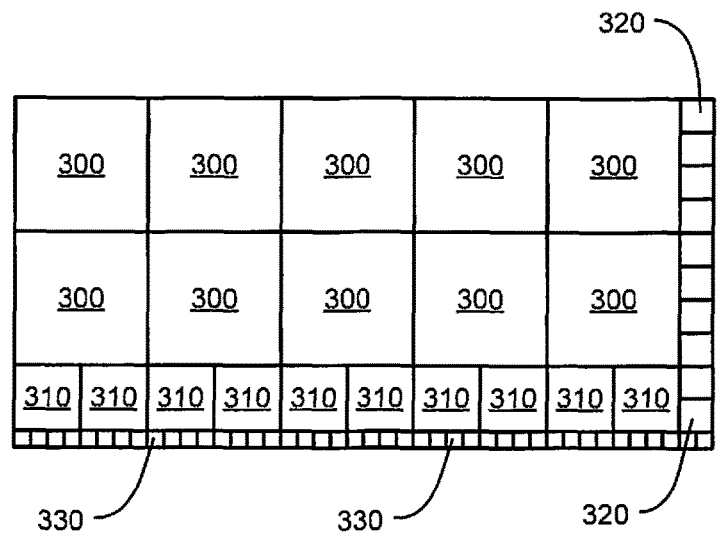
FIGS. 3A, 3B, 3C and 3D represent different initial block splitting strategies, i.e. strategies for partitioning an image into areas corresponding to blocks for encoding, using a method whose steps are illustrated in FIG. 2.

Referring next to FIG. 3A, from the foregoing, it will be appreciated that the method of encoding pursuant to the present disclosure employs, when appropriate, variable block or packet size for providing an optimal solution between data compression in the encoded output data 30 and substantially lossless compression, namely substantially without discernible loss. In FIG. 3A it is a question of coding an image where large coding blocks 300 are employed for an upper left hand corner of a given image, whereas smaller blocks 310, 320, 330 are required along right-hand-side and lower edge areas of the image for more accurately providing encoding of these areas. In the encoded output data 30, parameters describing image content of the blocks 300, 310, 320, 330 and the position of the blocks within the image are included in the encoded output data 30. Encoding methods employed for encoding the blocks 300, 310, 320, 330, for example different methods for different blocks 300, 310, 320, 330, are also defined in the encoded output data 30. The distribution of the blocks 300, 310, 320, 330 will vary depending upon spatial distribution of content within the images to be encoded.

FIG. 3A shows an example of the initial split of blocks in the image that is generated in the second step 110 of FIG. 2. This initial split of blocks does not necessarily require any additional information to be sent between the encoder and the decoder, because it can be based, for example, upon a size of the image. According to an embodiment, when a real split of a block is executed in the fifth step 140 of FIG. 2, then that information may be delivered from the encoder to the decoder, in manners different from those described earlier. A practical example on encoding an image is described later.

Figure 3B:
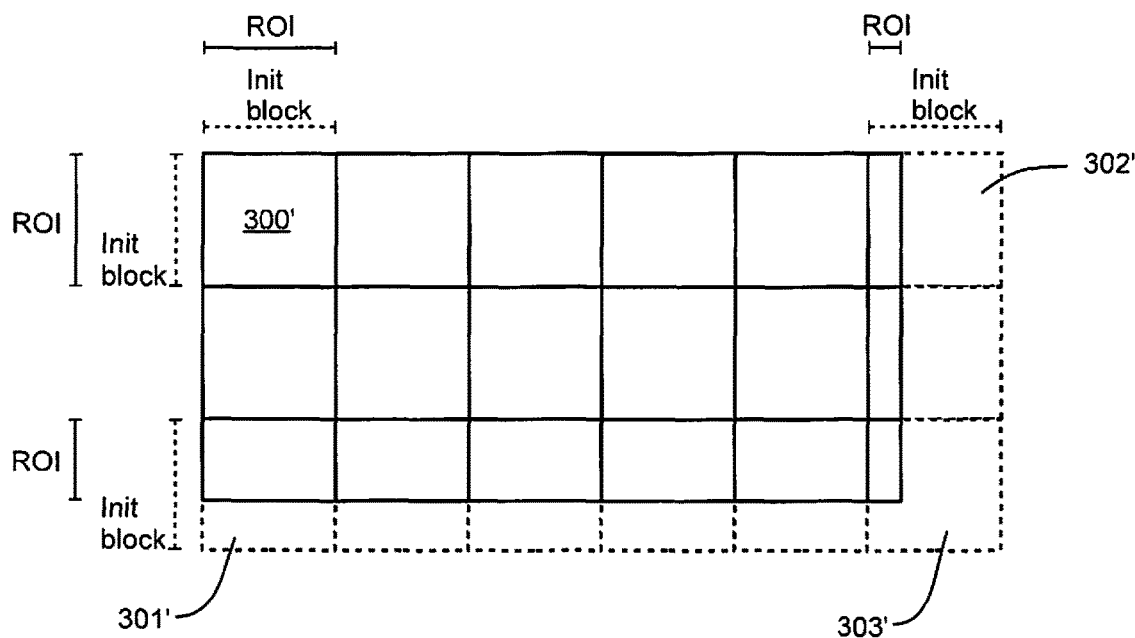
Figure 3C:
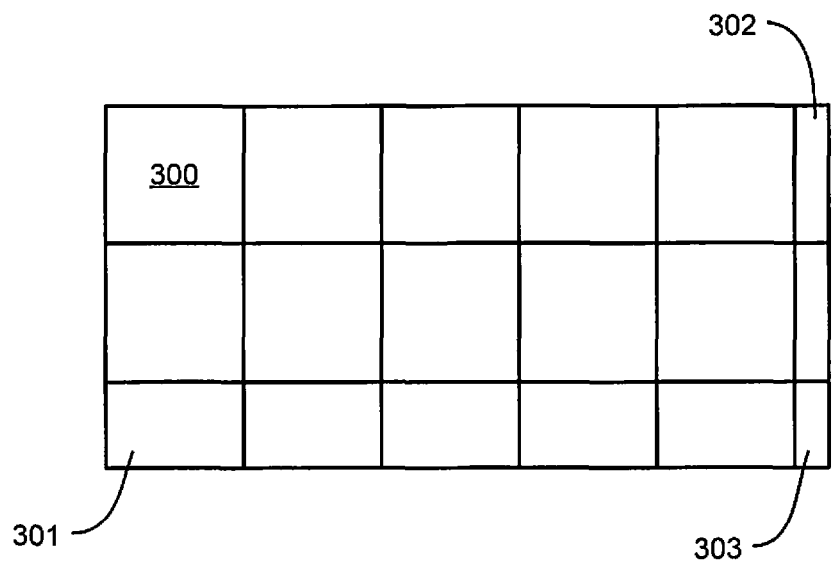
Figure 3D:
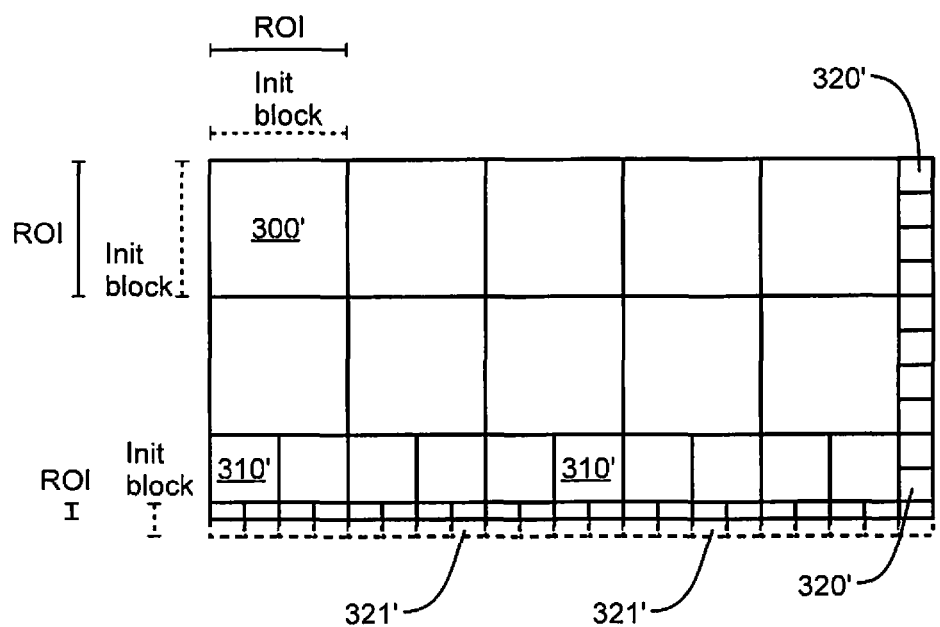

FIG. 3A, FIG. 3B, FIG. 3C and FIG. 3D represent different initial split solutions for different needs. The solution can be either pre-defined so that the encoder and decoder know the selected initial split solution, or alternatively the encoder can select the solution and then communicate that information to the decoder. The communication can contain information as to whether the resulting blocks are of equal or variable size, rectangular or non-rectangular, and whether ROI has been used. In FIG. 3B, all the blocks are equal-sized, but for the edge blocks 301', 302', 303' the Region of Interest (ROI) defines which areas contain actual (image) data. FIG. 3C is formed out of FIG. 3B in such a way that a ROI is not used any more, but in addition to square blocks, non-square rectangle blocks are used as well. In FIG. 3D the blocks are square, the maximum and minimum size is defined, and ROI is used at the edge.

Figure 3E:
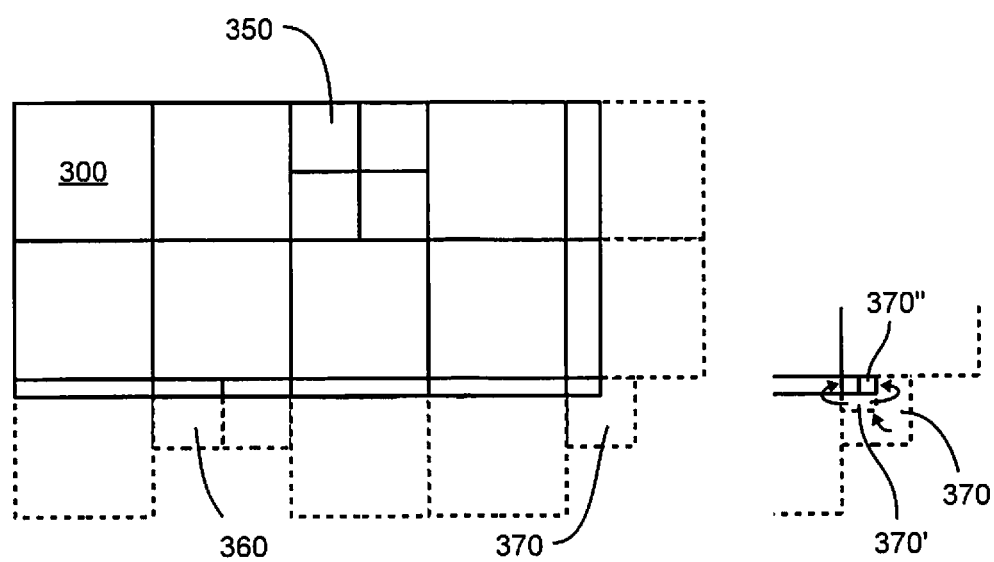
FIG. 3E represents first split examples executed for a FIG. 3B type split.

FIG. 3E presents a first division of three blocks after the initial split. Typically, a Region of Interest (ROI)=block, in which case the block 300 is split into blocks 350, as FIG. 3E illustrates. A block where the ROI is smaller than the block size is split into two new blocks 360, which then include a new ROI. When a block that contains a ROI is split, the resulting blocks do not necessarily contain a ROI which is of different size than the entire post-split block. However, in the case of the block 360, the post-split blocks also contain a ROI that is not the same size as the entire block. It should be noted that those two blocks that remain outside the ROI are omitted. As regards block 370, only one block remains after the split, because other sub-blocks did not contain valid image data.

It is also favorable to construct an implementation where the result of a block split is at least two blocks. In such an implementation, when a split decision is made, the splitting (370, 370', 370") is continued iteratively until the result contains more than one block, as can be seen in the small sub-figure of FIG. 3E.

In the foregoing, the following abbreviations have been used as given in Table 5. These various encoding formats are all potentially relevant for use when implementing the encoder 10, depending upon desired performance of the encoder 10.

Referring again to FIG. 2, it will be appreciated that the method pursuant to the present disclosure optionally completes encoding of at least one of images, video and audio, and then thereafter outputs the encoded output data 30. Alternatively, by way of a link after step 200 of FIG. 2 back to step 100 or 120, the method enables the encoded output data 30 to be output, for example streamed, concurrently with the method executing encoding steps on at least images, video and audio. Such operation is beneficial when the method of the present invention is employed to encode source data at a server site in real time for streaming to customers, for example for Internet-delivered multimedia services. The method is potentially thereby capable of functioning when only small data storage capacity is available, and user interruption of streamed encoded data, for example by the user selecting an alternative, and avoiding an entire video file being encoded when not required by the user, thereby saving computer processing resources. Such considerations are very important for contemporary multimedia streaming services operating, for example, via the Internet.

When sending the encoded output data 30, for example in a concurrent encoding/streaming situation as aforementioned, typically the highest level headers are sent first and thereafter encoded data related to a highest level of hierarchy is sent. Thereafter, encoded data relating to lower levels of hierarchy are sent. For example, in the encoded output data 30, image size data and image/video related data are sent first in the encoded output data 30, and thereafter information relating to splitting/combining of blocks, and thereafter the algorithms utilized in encoding the blocks and the encoded block data are communicated.

The encoder 10 can be implemented using computing hardware including a parallel processor architecture including a plurality of processors organized to process data in parallel. For example, on account of initial block splitting to provide the split blocks 300, 310, 320, 330, the split blocks 300, 310, 320, 330 can be distributed to the plurality of processors, for example to a first processor encoding the blocks 300, 310, 320 and to a second processor encoding the block 330.

During encoding, the number of channels employed by the encoder 10 to encode images, video and/or audio can be dynamically variable, for obtaining a greater degree of data compression in the encoded output data 30. For example, it is convenient to employ up to four channels, although images can include multiple layers that can be presented together. The layers optionally pertain to one or more of: subtitles, logos, multi-view images, and depth. Moreover, the layers optionally convey mutually different volumes of data. All associated layer data are encoded in the encoded output data 30 as separate channels, and an associated description regarding how the channels should be combined and used is also included in one or more headers included in the encoded output data 30.

TABLE 5

Abbreviations for transformations and/or coding methods applicable when implementing embodiments of the present disclosure

| 1D | 1-Dimensional (e.g. for a signal or packet) | MAD | Mean Absolute Difference |
|---|---|---|---|
| 2D | 2-Dimensional (e.g. for a block, image, stereo or multichannel audio) | MP3 | MPEG-1 audio layer 3 |

TABLE 5-continued

Abbreviations for transformations and/or coding methods applicable when implementing embodiments of the present disclosure

| 3D | 3-Dimensional (e.g. for video, stereo image, multichannel image) | MPEG | Motion Picture Experts Group |
|---|---|---|---|
| AAC | Advanced Audio Coding | MSD | Mean Square Difference |
| AVC | Advanced Video Coding | MVC | Multiview Video Encoding |
| BMP | Bitmap - file format | PCM | Pulse Code Modulation |
| DC | Direct Current | PNG | Portable Network Graphics |
| DCT | Discrete Cosine Transform | RLE | Run-Length Encoding |
| DPCM | Differential Pulse Code Modulation | SAD | Sum of Absolute Differences |
| FLAC | Free Lossless Audio Codec | SSD | Sum of Square Differences |
| GIF | Graphic Interchange Format | TIFF | Tagged Image File Format |
| JPEG | Joint Photographic Experts Group | VLC | Variable Length Coding |
| JPEG XR | JPEG extended Range | VQ | Vector Quantization |
| LZO | Lempel-Ziv transform based coding method | EM | Entropy Modifier |
| ODelta | ODelta coding method | SRLE | Split Run-Length-Encoding |

It will be appreciated that the splitting of blocks illustrated in FIG. 3 is merely an example. In a temporal sequence of images, for example a video sequence, objects depicted in the images with well-defined edges often are found to move about within a given field of view of the images, resulting in the splitting of blocks following movements of the objects. In still images the splitting of blocks typically creates the result that follows the edges in the spatial image. When the splitting of blocks is illustrated from the still image, the objects can often be detected from it.

The method of encoding pursuant to the present disclosure, for example as depicted in FIG. 2, is capable, via layer and channel encoding executed in the encoder 10, of supporting interactive video presentations for providing new types of content delivery services, for example, interactive commercial advertisements, different viewing perspectives when streaming live sports activities such as Formula 1 racing, and movies. For example, the encoder 10 allows for movies with localized subtitle layers, interactive watermarks, interactive pattern recognition, animated 2D/3D user interface (UI) buttons and so forth.

Figures 4A, 4B:
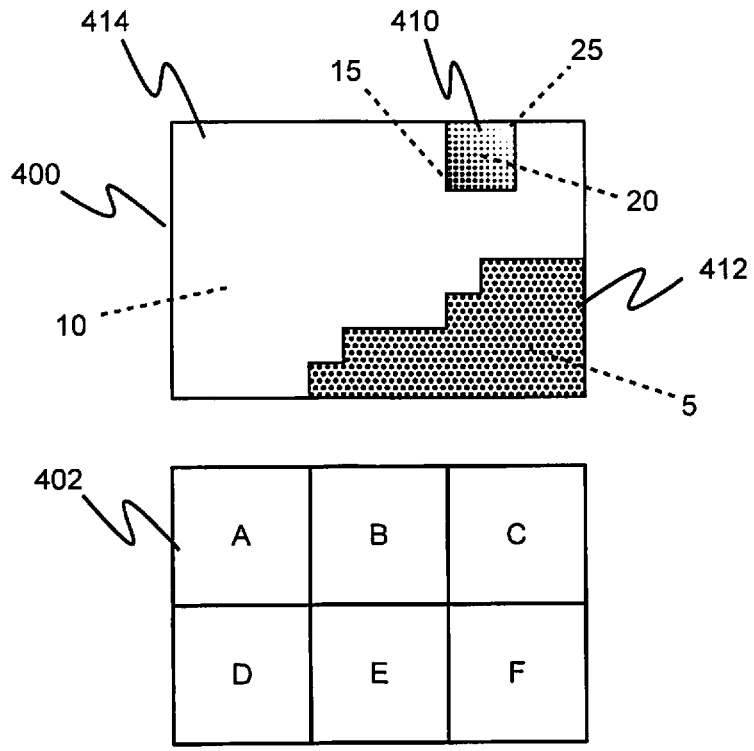
FIG. 4A is an example image and example initial image split to be used according to embodiments of the present disclosure.
FIGS. 4B and 4C are example images and examples on how sub-divisions and combinations of blocks can be determined and executed, and how and why decisions on whether to sub-divide or to combine blocks or packets are made, and in which format the results of these split and/or combine decisions can be communicated or delivered.
Figure 4C:
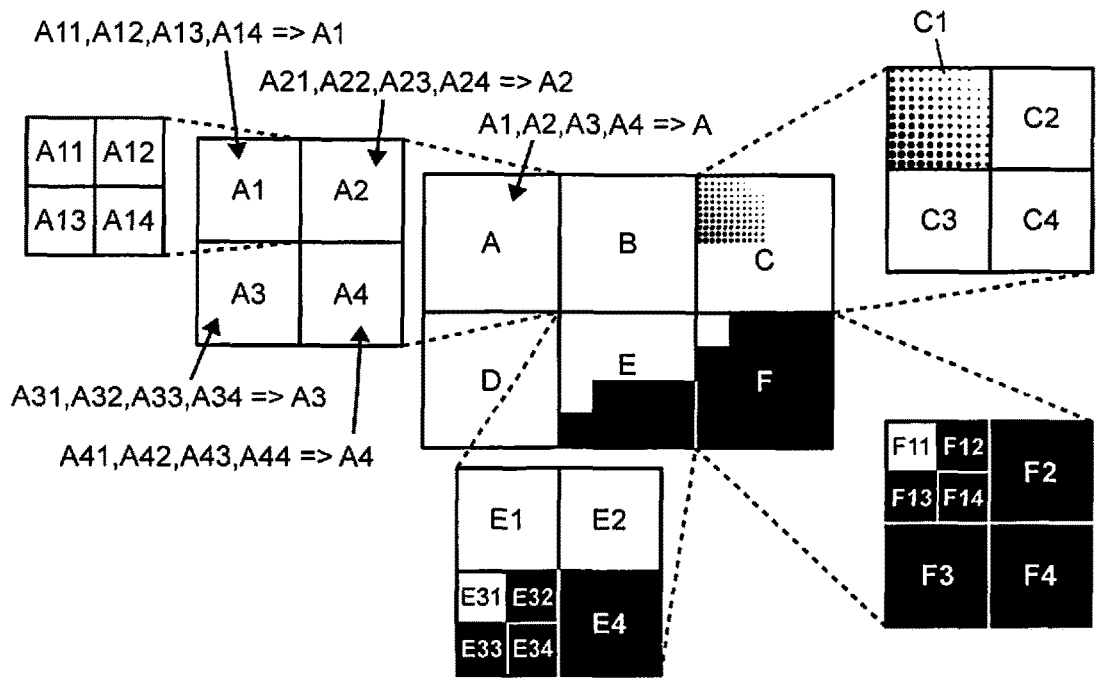

A simplified example of an embodiment of encoding is shown in FIG. 4A. Reference here is also made to FIG. 4C showing further details. An image 400 to be encoded has a flat blue area 414, shown as white in the FIG. 4A for clarity, a green area 412, shown dotted in FIG. 4A for clarity, and a sliding red area 410, shown in stippling in FIG. 4A for clarity. The size of image 400 can be arbitrary, for example 12×8 elements or pixels, or 24×16 elements or pixels, or 120×80 elements or pixels, and so forth. Initial block sizes 402 for the image 400 are selected as 4×4 elements or pixels, or 8×8 elements or pixels, or 40×40 elements or pixels respectively for different image sizes. In the embodiment, there are six element or pixel blocks A, B, C, D, E and F as illustrated. According to the embodiment, the first block A is analyzed. The block A is determined from the analysis to be uniform and consisting of only blue, with the color value being represented by the number 10. The block A is considered as one area. The block B is analyzed next. The block B consists also of only blue, therefore it is considered as one area. The block C is analyzed next. The block C is not uniform, and therefore it is split into four sub-blocks denoted by C1, C2, C3 and C4 as shown in FIG. 4C. The first sub-block C1 is analysed. It consists of a sliding red area, with a color value of 15 in its lower left corner, values of 20 in top-left and bottom-right corners of the sub-block C1, and a value of 25 in top-right corner of the sub-block C1. The sub-block C1 is considered as one area. The sub-blocks C2, C3 and C4 are then analyzed respectively. The sub-blocks C2, C3 and C4 consist of flat blue and are each denoted as flat blue areas. The block D is analyzed next. The block D has only one color, namely flat blue, and is thus considered as one area. The block E is analysed next. The block E is not uniform and it is thus split into four sub-blocks E1, E2, E3 and E4 as shown in FIG. 4C. The sub-blocks E1 and E2 are both uniform with a color of flat blue. The sub-block E3 is not uniform and it is further split into four sub-blocks E31, E32, E33 and E34. Each sub-block E31, E32, E33 and E34 is analyzed. The sub-block E31 is analyzed and determined to consist of uniform color of blue and is marked as a flat blue area. The sub-blocks E32, E33 and E34 are analyzed to be green, with a color value of 5 as an example, and are designated to be green. The sub-block E4 is analyzed and determined to be uniform and designated as the color green. The block F is analyzed and determined not to be uniform. The block F is split to four sub-blocks F1, F2, F3 and F4 as shown in FIG. 4C. The sub-block F1 is analyzed and determined not to be uniform. The sub-block F1 is split further to sub-blocks F11, F12, F13 and F14. Each sub-block F11, F12, F13 and F14 is analyzed. The sub-block F11 is determined to be uniform with a color blue. The sub-blocks F12, F13 and F14 are determined to be uniform with a color green. Values are associated with blocks and sub-blocks respectively. The sub-blocks F2, F3 and F4 are further analyzed and determined to be uniform with a color green. Values are associated with the blocks and sub-blocks respectively.

Figure 4D:
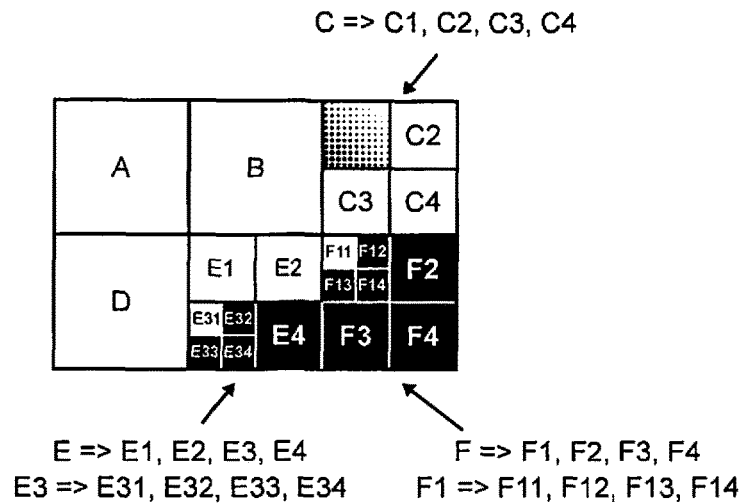
FIG. 4D is an example of blocks of the example image of FIG. 4A

An example of implementing code for the aforementioned encoding process is to give a value "0" for a block which is not split, and a value "1" for a block which needs to be split. Using such logic, the above example is coded as the following Split Bits:

0 0 1 0000 0 1 0010 0000 1 1000 0000, wherein a first two logic values "0" illustrate that the two initial blocks A, B are not split, the third block C is split and defined by a logic value "1" as aforementioned, but the sub-blocks are not split, the fourth block D is not split, the fifth block E is split, the first two sub-blocks E1, E2 are not split, but sub-block E3 is split, and so forth. The Bit String can further be, for example, run length coded. FIG. 4C illustrates how and why the split bit string above is constructed. Reference is made to the below explanation of FIG. 4C. The '0000' sections are needed if the minimal block size is smaller than the size of block F11 in FIG. 4C. FIG. 4D is the end result of the splittings conducted in FIG. 4A.

It should be appreciated that in some embodiments, where the block is already of a minimum size, there is optionally no need to deliver a split bit "0" to indicate that the block in question shall not be split, as the decoder knows already based on the delivered size information that the block in question cannot be split further. The same applies to the combination of blocks when a block is already of the defined maximum size. The defined minimal and maximal block sizes need to be known previously, or else the encoder will determine them and then deliver them to the decoder. The split bit string in the example of splitting blocks above would in such a case be as follows:
0 0 1 0000 0 1 0010 1 1000

This will be the case if it is previously known that the sizes of the blocks E31 . . . E34 and F11 . . . F14 are already equal to the minimal defined block size. This means that they cannot be split further, and thus separate split bits do not need to be delivered for them to express that the block shall not be split anymore. FIG. 4C presents the split bits of the block so that the bits of each init block A . . . F have been distinctly separated from one another.

A simplified example of an embodiment of encoding where blocks are combined is shown in FIG. 4B and in FIG. 4C. An image to be encoded residing in the small blocks A11 . . . F44 in FIG. 4B is to be combined into larger blocks. The white color in the Figure represents a flat blue area, the black color in the Figures represents a green area and the area shown as dotted/spittled, namely blocks C11 . . . C14, represents a sliding red area.

FIG. 4C shows a combined image where the small blocks A11, A12, A13 and A14 have first been combined into a larger block A1, and correspondingly the small blocks A21, A22, A23 and A24 combined into a larger block A2, the small blocks A31, A32, A33 and A34 combined into a larger block A3, and the small blocks A41, A42, A43 and A44 combined into a larger block A4. After this the new blocks A1, A2, A3 and A4 have been further combined into a larger block A. A similar combining procedure has been executed for the B11 . . . B44 blocks and for the D11 . . . D44 blocks. It is to be noted that all of the color values in the original small blocks now contained in the combined blocks A, B and D are the same, so those blocks can be easily combined afterwards. (It would not make sense to split these blocks any more, but it would be easy to do so).

As regards the small blocks C11 . . . C44 however, all values therein are not the same: the blocks C11 . . . C14 differ from blocks C21 . . . C44. Therefore, blocks C11 . . . C44 can be combined into blocks C1, C2, C3 and C4 but not further into one block C. Similarly, as regards the small blocks E11 . . . E44, all values therein are not the same: the blocks E11 . . . E14 are of the same color (value) and can be combined into a larger block E1. Also the blocks E21 . . . E24 are of the same color (value) and can be combined into a larger block E2.

Further, the blocks E41 . . . E44 are of the same color (value) (that however differs from the color of blocks E1 and E2) and can be combined into a larger block E4. The small blocks E31 . . . E34, however, are not all of the same color (value), and thus they cannot be combined. As regards the small blocks F11 . . . F14, blocks F21 . . . F44 are all of the same color (value) and they can thus be combined into larger blocks F2, F3 and F4, but not further, because the small block F11 has a color (value) that differs from that of the blocks F2, F3 and F4 and also from the small blocks F12, F13 and F14. Therefore, the small blocks F11 . . . F14 cannot be combined to one large block F1.

The tables in the lower part of FIG. 4C show the distribution of combine bits, split bits, and split/combine bits, namely the three alternative ways of expressing and delivering the result of the segmentation to the decoder. To clarify, only one table/set of values is delivered, depending on the embodiment. That is, the table on the left in FIG. 4C represents the combine bits, while the middle one presents the split bits and the table on the right represents both the split and combine bits. It can be seen in the tables that in the split table, '1' is equal to "was split", while '0' is equal to "was not split". Correspondingly, in the combine table, "was combined is equal to '1' and "was not combined" is equal to '0'.

First, the processing of combine bits in the table on the left is explained. For blocks A, B and D, the first four values '1' in the table on the left indicate that the original small blocks A11 . . . A44 could all be combined into blocks A1 . . . A4, and the single value '1' therein indicates then that the blocks A1, A2, A3 and A4 can be further combined into a larger block A. For blocks B and D, the process is the same. The split bits of the larger blocks A, B and D in the middle table consequently have the value 0, because, due to the uniformity of the blocks, they do not need to be split to gain coding efficiency. Correspondingly, the split/combine values for these blocks in the table on the right are 00, where the first zero indicates that the split direction was selected, and the second zero indicates that the block will not be split.

However, as regards the C blocks, the first four combine values there too are '1111', indicating that that the smallest blocks were combined, but the subsequent rightmost single combine value '0', which indicates that the blocks C1 . . . C4 will no longer be combined into one block C.

As regards the split bits of block C, they are consequently '1 0000' as shown in the middle table of FIG. 4C. The split/combine bits in the table on the right are '0 1 0000'. These values occur because the split direction was selected, which accounts for the '0', and C is divided into four segments (C1, C2, C3 and C4), which produces the '1', and none of the new blocks will be split further, which is indicated by '0000'. That is, the first zero in the table on the right that presents split/combine bits indicates that the split direction was selected, and thereafter the following values correspond to the values in the middle table that presents the split bits.

As regards the E blocks, the four combine values there are '1101'. That is, blocks E11 . . . E24 are combined to blocks E1 and E2, blocks E31 . . . E34 are not combined and blocks E41 . . . E44 are combined to a block E4. Correspondingly, the values for the block E are '1 0010' in the table that presents the split bits. The values in the table that presents split/combine bits are '1 0010' because, firstly, the combine direction was selected for block E, thus '1', followed by the combine bits in reverse order to that of the combine bits in the table on the left. The reverse bit representation was selected in this case because the reverse order helps minimize the total amount of bits with value '1'. This representation of split/combine bits for block E also serves as an example on how selections, decisions and the bit strings used to represent them can be freely defined, as long as the encoder and the decoder operate according to the same definitions.

As regards the F blocks, the four combine values therein are '0111', indicating that the blocks F21 . . . F44 were combined to blocks F2, F3 and F4. '0' in the beginning indicates that F11 cannot be combined with F12, F13 and F14. The values for the block F in the table that indicate split bits are '1 1000'. The values in the table that indicate split/combine bits are also '1 1000', because the combine direction was selected, thus the first bit is '1', which is then followed by the corresponding combine bits from the table on the left, in reverse order. As stated above, the three tables in the lower part of FIG. 4C represent three alternative ways of expressing and delivering the result of the segmentation to the decoder, only one of which is actually delivered.

The blocks A . . . F depicted in the examples are the fundamental blocks, namely init blocks, of the method pursuant to the disclosure They are of maximum size whereas the blocks A1 . . . to F44 are of minimum size. Those fundamental (init) blocks are handled as independent sections during the processing. The size of these blocks determines how much memory bandwidth and other processing requirements are needed. Each of those init blocks is usually processed from beginning to end before proceeding to the next init block, one at a time. Of course, the init blocks can also be processed in parallel, but even in that case, in the process pursuant to the disclosure, their data is assembled in such a fashion that after the parallel processing, the data belonging to one individual init block are usually placed together in a sequence, followed by the data belonging to another init block, etc.

In cases when the segmentation of data is executed into the split direction, then these init blocks A . . . F are also blocks produced by the initial segmentation performed in the beginning of the processing. The splitting of blocks that may be executed later use these blocks as their starting point. These blocks are then split according to the split bits. It is for this reason that these blocks are called 'init blocks' in this application, even though the initial segmentation in the beginning of the processing in case of combine direction typically produces far smaller blocks than these init blocks.

Now, when the initial segmentation is executed in the split direction, then maximal blocks (i.e. typically the same size as init blocks) are usually used as the starting point. That is, the splits of split direction are commenced, and they may continue until minimal block size is reached. Correspondingly, when blocks are processed in the combine direction, the initial segmentation typically starts with minimal sized blocks that may then be combined up until the maximal block size. However, regardless of which direction is used, the process is usually executed one init block at a time. Of course, it is also possible to combine init blocks with each other as in FIG. 4H, but in such a case, memory consumption and algorithm complexity would increase considerably. Combining init blocks with each other would cause a large part of the possible advantages with regard to parallelization of processes would be lost. If init blocks are not combined with each other, then init blocks can be processed in parallel, and often even entirely independent on one another.

Figure 4E:
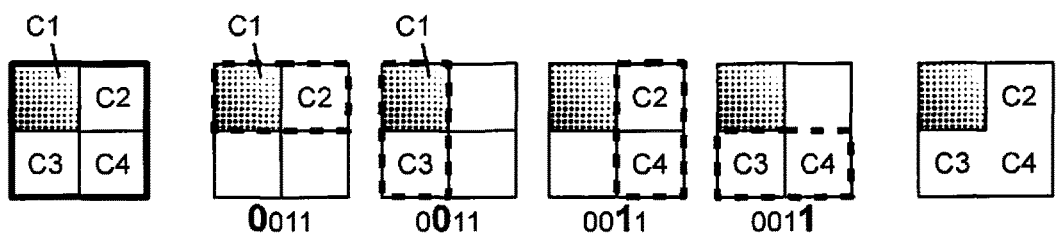
FIGS. 4E, 4F, 4G, 4H, 4I and 4J are example images and examples on how combinations of blocks inside init blocks can be determined and executed, and how and why decisions on such combinations are made.
Figure 4F:
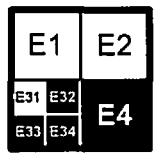
Figure 4F:
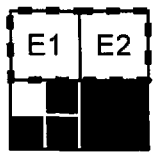
Figure 4F:
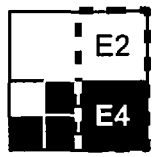
Figure 4F:
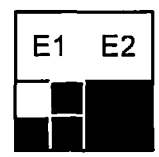
Figure 4F:
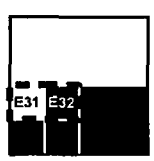
Figure 4F:
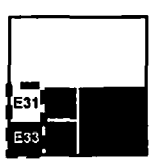
Figure 4F:
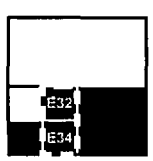
Figure 4F:
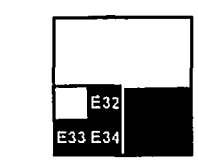
Figure 4G:
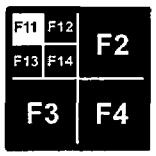
Figure 4G:
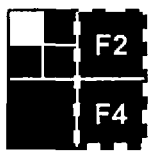
Figure 4G:
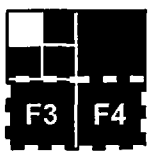
Figure 4G:
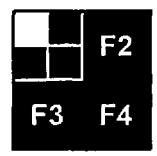
Figure 4G:
Figure 4G:
Figure 4G:
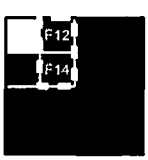
Figure 4G:
Figure 4H:
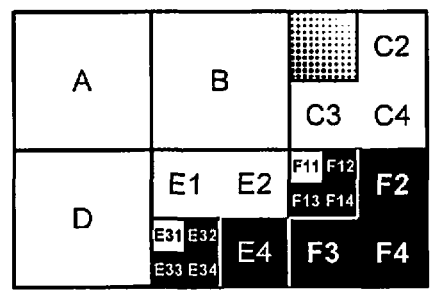

FIGS. 4A . . . 4D represent scenarios where init blocks are independent and their internal blocks are of regular size. There are many different methods available for handling these type of blocks. In FIGS. 4E . . . 4I scenarios are introduced where the init blocks are still independent, but the blocks inside them do not need to be regular. This kind of block division produces irregular blocks for which some methods can no longer be used. However, the segmentation therein will be more detailed and more accurate, which may help decrease the total amount of method bits.

FIG. 4E, FIG. 4F, FIG. 4G, FIG. 4H and FIG. 4I illustrate the following: if the initial segmentation had been conducted for example by splitting, or with any of the three alternative ways explained above, then after the initial phase, combinations can be executed first inside the blocks and then between the blocks. Such a procedure may yield a more accurate segmentation alternative that would also be more efficient with regard to coding. The bit value highlighted in FIGS. 4E . . . 4G and 4I with bold font indicates the decision of the combination ('1'="was combined" and '0'="was not combined") for the highlighted combine decision. In the rightmost images in all the figures, the result of the combining process for each init block or for the whole sequence of data is depicted.

Figure 4I:
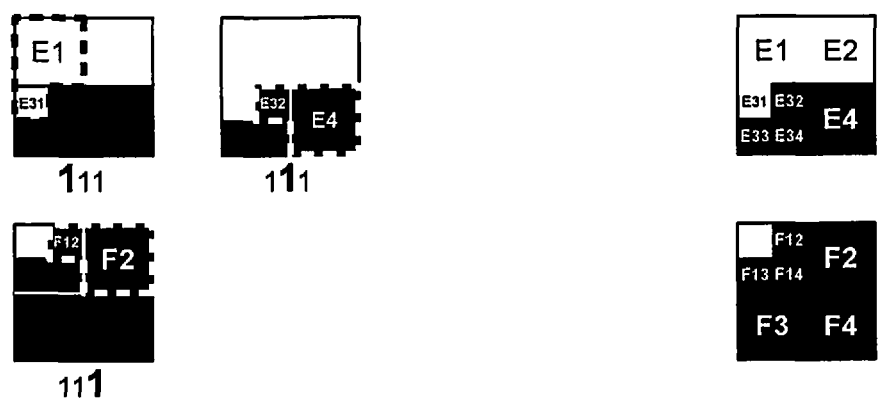
Figure 4J:
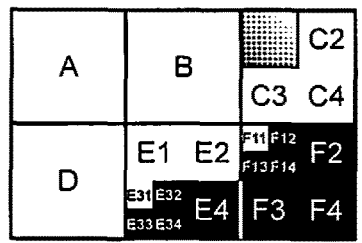
Figure 4J:
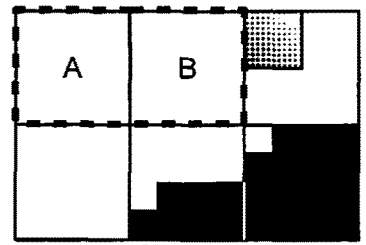
Figure 4J:
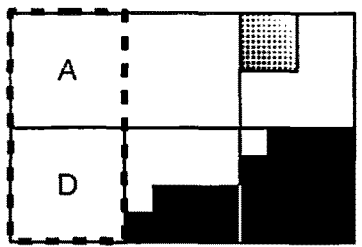
Figure 4J:
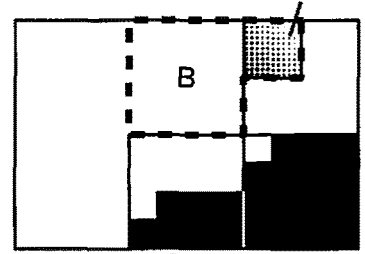
Figure 4J:
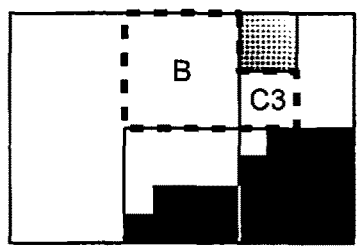
Figure 4J:
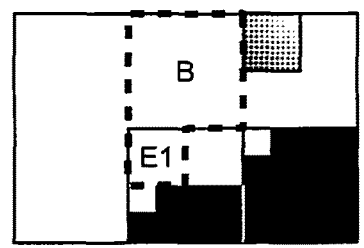
Figure 4J:
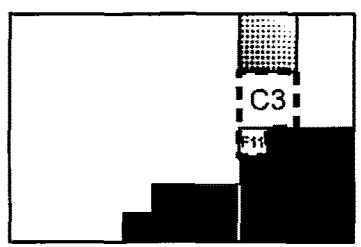
Figure 4J:
Figure 4J:
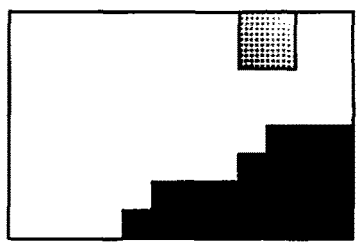

In FIG. 4J, the independency of the init blocks has been omitted, and the blocks therein are irregular. These alternative scenarios illustrate the possibility to utilize the method pursuant to the disclosure in such a way that, initially, segmentation is performed with less accuracy, processing in a simpler fashion, so that the amount of split/combine bits is small and the amount of bits used by the method is rather large. In the second and third step, the accuracy of the segmentation can be increased by using combine bits, which thus decreases the amount of bits used by the method. In the following there will be described a few practical examples on applying different segmenting methods, thereby further elucidating the aforementioned aspects.

FIG. 4J represents a scenario where combinations are executed between different init blocks, instead of combining the blocks inside the init blocks (A, B, C, D, E, F) as was the case in the examples depicted in FIG. 4B . . . FIG. 4I. That is, FIG. 4J illustrates attempts to combine blocks e.g. between A and B (doable, so the combine bit is '1') or between B and C1 (not doable, so the combine bit is '0'), etc. The table in the lower right corner of FIG. 4J represents the result of the attempts, wherein '1' indicates a possible/successful combination and '0' indicates an impossible/unsuccessful combination.

It should be appreciated that in the example in FIG. 4J, combine bits have not been used to express such decisions that are already known based on prior decisions. For example, there is no need to express that block E2 was combined with block F11, because the combination of blocks C3 and F11 already combined E2 and F11. Correspondingly, there is no need to express that blocks C3 and F12 were not combined, or that block D was not combined with E33, neither is there a need to express that E2 was not combined with F13, because C3 was already combined with block F11 and it was observed during the block-internal combinations that the blocks F11 and F13 cannot be combined with each other.

It is to be also noted that the order in which the combination of blocks is attempted is usually essential: the procedure starts from the upper left corner, moves first to the right and then down, one block border at a time. However, optionally, the order can be changed, and the splits and combinations conducted in the examples are not meant to restrict the embodiments pursuant to the disclosure. Therefore any attempted combination of blocks, for example from one neighbouring block to another, or to a non-neighbouring block is foreseen.

The following example describes the use of coding methods in a segmentation scenario as described in connection with FIG. 4C:

A further "fill" method, namely method selection, for each block can be coded, for example with a logic value of "0" for assigning flat color for the block, and a logic value "1" for assigning sliding color for the block, referred to as Method Bits:

0 0 1000 0 0000000 0000000

In the code, first two blocks A, B are a flat color, the next block C1 is sliding and the remainder blocks are a flat color. The Method Bits can further be, for example, run length coded. It should be appreciated that using bits is only one example of indicating method selection. Often, there are more than two methods available for selection, and in such a case, other ways can be implemented to indicate the selection. For example, a piece of method selection information can be used that indicates the number of the selected method. In that case, e.g. the DC method could receive the value 1, SlideBiCubic could receive the value 2, DCT could receive the value 3, CopyLeft could receive the value 4 etc. The pieces of method selection information thus produced can then later be entropy-coded, in order to minimize their bit count. The same number can be used for describing the same coding method even for the blocks or packets of different size because information regarding the size of the blocks is communicated otherwise, for example, by minimum/maximum size information, using split/combine bits etc. Optionally, coding methods for different sized blocks can be communicated with different numbers if coding efficiency is achieved. For example, probabilities of using a coding method can be very different in respect of blocks or packets of different sizes and it is typically beneficial to number the methods based on the probability order.

It should be appreciated that for flat areas, such as blocks, in the input data, it is advantageous to select the DC method as the coding method, because it produces only one DC parameter per block to be coded. Correspondingly, for a sliding area in an input data, it is advantageous to select as the coding method the slide method that produces four parameters. It should be noted that in the method pursuant to the disclosure, for the blocks or packets of the same size there can be different coding methods used, such as for example, in the above example for the blocks C1 and C2 of the same size, the slide and DC methods were used.

Color values respectively for the blocks are referred as Values, as follows:

10 10 20 25 15 20 10 10 10 10 10 10 5 10 5 5 5 555 10 5 5 5 wherein a set "20, 25, 15, 20" describe color values of each corner of the block C1. The string of values can be, for example, Huffman coded to reduce data size. Moreover, since the group of sub-blocks E31, E32, E33 and E34 and the group of sub-blocks F11, F12, F13 and F14 have the same color value combination and order, namely (10, 5, 5, 5), it can be considered as one element and designated its own value, referred to as a Combination Value. The Combination Value can be stored in a database, for example of the encoder or a corresponding decoder, and referred to as a Reference Identification number when needed. Often, it is beneficial to use separate streams for values for different methods, for example, in the foregoing example where DC values and slide values can be set to separate streams. Some methods optionally also generate multiple streams by themselves to enable a smaller entropy for each stream that enables better compression efficiency within entropy coding methods, for example using a multilevel coding method wherein high and low levels used when implementing the method can be set to process separate streams, because often high values are closer to each other, similarly as low values are closer to each other, and then employing range coding that uses delta coded high or low values and thus operates efficiently.

According to embodiments, Split Bits, correspondingly Combine Bits, Method Bits, as well as other ways to indicate splitting and/or combining and the coding method applied, Values and Combination Values can be stored in encoder hardware, for example for subsequent supply to other hardware for decoding purposes.

The segmentation performed in FIG. 4E . . . I would be expressed as method selection bits per init block as follows:

0 0 1 0 0 0 0 0 0 0 0

The corresponding color values, i.e. the method parameters, would then be as follows:

10 10 20 25 15 20 10 10 10 5 10 5 10 5 5

The segmentation performed in FIG. 4I whose effects are depicted in FIG. 4J in the first image 'State before combining' (the one in the upper left corner) would be expressed as method selection bits per init block as follows:

0 0 1 0 0 0 0 0 0

The corresponding color values, i.e. the method parameters, would then be as follows:

10 10 20 25 15 20 10 10 10 5 10 5

After the segmentation executed in FIG. 4J, the method selection information would be as follows:

0 1 0

The corresponding color values, i.e. the method parameters, would then be as follows:

10 20 25 15 20 5

The depicted example demonstrates how the amount of method selection bits and the amount of method parameters can be considerably decreased by adding a few combine bits.

It should also be noted that the split/combine bits described above can be sent in different orders. One possible alternative scenario would be such where each stage is processed separately. In this scenario, if the combine direction would have been selected already in the first stage, then all the combine bits would be as follows:

1111 1 1111 1 1111 0 1111 1 1101 0111 0011 10 0011 11 0011 11 1 1101111

However, it often makes sense to deliver the combine bits of the first and the second stage so that the bits are placed sequentially init block by init block. If a third stage is available, then the combine bits of the third stage can be added to end of the bit string. In this scenario, the bits would be as follows for the first two stages:

1111 1 1111 1 1111 0 0011 1111 1 1101 10 0011 11 0111 11 0011 1

A reordering of bits such as this often does not affect the total amount of compressed bits. However, reordering has a significant effect on which order the processing is executed and on how much the processing can be parallelized in any given situation.

However, if the split/combine alternative would be selected at the first stage, and if the second stage would be the combine alternative, then it would be beneficial to separate the selection of the split/combine direction into its own stream, and the other stream would then contain the bits produced by the splits and combinations init block by init block. In such a case, the bits would be as follows:

The selection bits for the split/combine direction would be 0 0 0 0 1 1

Then, the bits are expressed in a way that maximizes the count of ones, in which case the designation for the split direction would be 0 and thus the designation for the no-split direction would be 1. Thus, the split/combine bits for the first two stages would be as follows:

1 1 0 1111 0011 1 1101 10 0011 11 0111 11 0011 1

Figure 5:
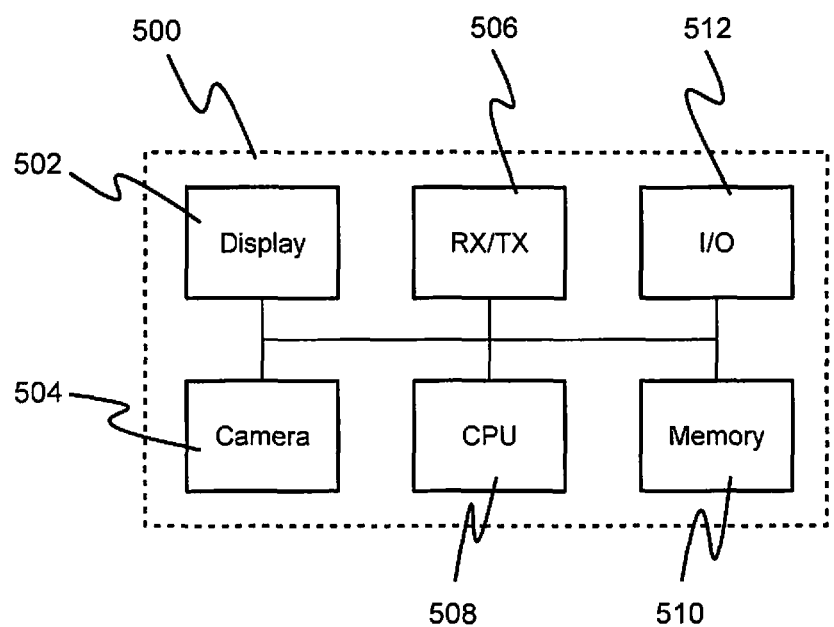
FIG. 5 illustrates blocks of a portable device in which encoding is implemented.

In one embodiment, the encoding can be implemented in a portable device 500 as shown in FIG. 5, such as a smart phone, a digital camera or a video camera. The portable device 500 optionally includes a camera (KAM) 504 for capturing one or more images, a display (DISP) for showing the one or more images, a receiver/transmitter (RX/TX) 506 to enable communication using cellular wireless networks or local area networks, and other Input/Output (I/O) devices 512 such as a Universal Serial Bus (USB) or Ethernet. The portable device 500 optionally also includes a Central Processing Unit (CPU) 508 for executing encoder related algorithms and instructions, a memory (MEM) 510 for storing the one or more images from the camera 504, and software for the encoder and encoded image content. The portable device 500 is beneficially configurable to store one or more encoded images in its local memory 510, and/or it can be configured to send periodically, upon request, upon user action, in real-time or substantially real time, encoded images via the receiver/transmitter (RX/TX) 506 or via the Input/Output (I/O) 512 to external systems.

The method beneficially uses an RD value as quality criteria, which value is computed by adding the estimated amount of used bits multiplied by alpha to a distortion value. The distortion value used is usually the sum of the squared decoding errors (deviations from the original values) per a sequence of data.

In the foregoing, RD optimization is employed to minimize an RD value which is derived from Equation 1 (Eq. 1) as follows:

$$RD = (E) + (\lambda \cdot (B_c)) \qquad \text{Eq. 1}$$

wherein
E=error;
$\lambda$=a coefficient defining a cost of a bit count as a function of the error E;
$B_c$=bit count.

The error E can be, for example, MAE, MSE, MAX or some weighted combination of such parameters, for example MAE+MAX. The parameter $\lambda$ refers to the aforesaid coefficient with which a cost of the bit count BC can be made comparable with regards to the error E. The parameter $\lambda$ becomes larger as less bits are used for encoding, wherein more error is allowed, namely in a situation where there arises a large data compression corresponding to a smaller quality criterion value. Correspondingly, the parameter $\lambda$ becomes smaller as more bits are used for encoding, wherein less error is allowed, namely in a situation where there arises a small data compression corresponding to a greater quality criterion value.

In respect of encoding quality criterion, it can, for example, be associated with evenness, such as a measure of variance. An estimate of the RD value is often beneficial to employ, because it decreases an amount of processing required when determining encoding quality. The value of bit count used in the RD-value calculation is often estimated, because the actual value is often very difficult to calculate, since it depends on other data values and selected entropy coding method. Bits can be estimated based on the amount of bits needed for value delivery, multiplied by an estimated compression factor that can be predefined for the data stream or it can be modified adaptively based on the previous compressed and delivered data.

When implementing the aforementioned embodiments, data compression employed includes two distinct phases. A method for data compression is selected that produces selection information, wherein the selection information defines the method and types of quantized data generated by the method. The selection information can be entropy coded, for example for inclusion in the output data 30. When generating the output data 30, it is also optionally possible to employ multiple streams, for example for whole images or for init-blocks. Employing such multiple streams is beneficial in reducing entropy in the compressed output data 30.

Modifications to embodiments described in the foregoing are possible without departing from the scope and spirit of the invention as defined by the accompanying claims. Expressions such as "including", "comprising", "incorporating", "consisting of", "have", and "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist in an understanding of the claims and should not be construed in any way to limit the subject matter claimed by these claims.

The invention claimed is:

1. A method of encoding input data to generate corresponding encoded output data, the method comprising:
   (a) processing the input data containing multiple channels to separate channels;
   (b) processing each channel into a plurality of blocks or packets, the blocks or packets having a size depending upon one or more parameters describing data content and/or data type of the input data, and the blocks or packets being of one or more sizes;
   (c) applying a plurality of mutually different transformations or combinations of transformations to content of the blocks or packets to generate corresponding transformed data;
   (d) checking a quality of representation of the transformed data of the blocks or packets compared to the content of the blocks or packets prior to application of the plurality of mutually different transformations or combinations of transformations to select one or more coding methods for individual blocks or packets;
   (e) encoding the input data with the selected one or more coding methods to generate encoded output data for each channel separately; and
   (f) communicating in the encoded output data information describing the plurality of mutually different transformations or combinations of transformations employed when coding the blocks or packets separately for each channel.

2. The method as claimed in claim 1, further comprising providing the one or more parameters describing the data content and/or data type of the input data in the encoded output data.

3. The method as claimed in claim 1, further comprising
   in an event that the quality of representation of the transformed data of one or more blocks or packets does not satisfy the one or more quality criteria, dividing or combining the one or more individual blocks or packets whose quality of representation does not satisfy the one or more criteria further and repeating step (c) for the one or more blocks or packets whose quality of representation does not satisfy the one or more criteria, for each channel separately; and
   providing information indicative of dividing or combining the one or more individual blocks or packets in the encoded output data for each channel separately.

4. The method as claimed in claim 1, further comprising providing the plurality of mutually different transformations or combinations of transformations within the selection of one or more coding methods in the encoded output data.

5. The method as claimed in claim 1, further comprising using the plurality of mutually different transformations or combinations of transformations to compress content associated with the blocks or packets, so that the encoded output data is smaller in size than the input data to be encoded.

6. The method as claimed in claim 1, further comprising arranging for the one or more quality criteria to be dynamically variable during encoding of the blocks or packets depending upon the one or more parameters describing content included within the blocks or packets.

7. The method as claimed in claim 1, wherein the blocks or packets are sub-divided or combined so that the content of the blocks or packets described by at least one of representative parameters is substantially flat.

8. The method as claimed in claim 1, wherein the blocks or packets correspond to a series of data, wherein subdivision of the input data corresponding to a given information to form a plurality of corresponding blocks is made dependent upon content present in one or more data preceding the given information within the temporal sequence of data.

9. The method as claimed in claim 1, further comprising adding header information to the transformed data in step (e) to generate the encoded output data, wherein the header information includes information indicative of the plurality of mutually different transformations or combinations of transformations employed in step (c).

10. The method as claimed in claim 1, wherein step (c) further comprises retrieving supplementary information from a database arrangement for use when executing said plurality of mutually different transformations or combinations of transformations, wherein the supplementary information includes at least one of: algorithms, rules, or one or more transformation parameters.

11. The method as claimed in claim 10, further comprising adding header information to the encoded output data indicative of the database arrangement for enabling subsequent decoding of the encoded output data to access said supplementary information when decoding the encoded output data.

12. The method as claimed in claim 1, further comprising employing for the transformations two or more of: a data base coding method, a DC-value coding method, slide coding method, scale coding method, line coding method, multilevel coding method, unchanged coding method, interpolation coding method, extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), Variable Length Coding (VLC), Huffman-coding, arithmetic coding, range coding, transform coding, delta coding, ODelta coding method, DDelta coding method, IDelta coding method, PDelta coding method, IntraMV coding method, InterMV coding method, color conversion coding method, quantization, wavelet transform, Hadamard transform, linear transform or inverse coding methods of all of the foregoing.

13. The method as claimed in claim 1, further comprising encoding at least one of video, image, audio, graphics, economic data, mask data, multidimensional data, measurement data, text data, texture data, ECG, seismic, analog-to digital (ADC) converted data, biomedical signal data, genomic data, ASCII, Unicode, calendar data, mathematical data or binary information present in the input data.

14. The method as claimed in claim 1, further comprising encoding the multiple channels or layers in the encoded output data for providing at least one of: interactive video, commercial advertisements, a plurality of viewpoints during sports event reporting, interactive watermarks, interactive pattern recognition, or animated 2D/3D user interface buttons.

15. The method as claimed in claim 1, further comprising providing the encoded data to at least one of following destinations: a data memory device, a communication network, a memory card, data memory disks, or local area communication networks (LANs), directly to a decoder.

16. The method as claimed in claim 1, wherein step (b) comprises initially splitting the input data into one or more blocks based on at least one of:
 (1) image resolutions;
 (2) an amount of input data;
 (3) a content of input data;
 (4) maximum and/or minimum block or packet size;
 (5) a quality parameter;
 (6) a dynamic range of the input data;
 (7) a variance of the input data; or
 (8) whether the input data is divisible into several channels.

17. The method as claimed in claim 1, further comprising utilizing only a single processing unit.

18. The method as claimed in claim 1, further comprising utilizing only a single memory device.

19. The method as claimed in claim 1, further comprising setting the one or more parameters to relate to at least one of constant value, sliding parameter value, or repetitive pattern.

20. A non-transitory computer-readable data storage media comprising computer instructions which when executed by a processor cause the processor to:
 (a) process input data containing multiple channels to separate channels;
 (b) process each channel into a plurality of blocks or packets, the blocks or packets having a size depending upon one or more parameters describing data content or data type of the input data, and the blocks or packets being of one or more sizes;
 (c) apply a plurality of mutually different transformations or combinations of transformations to content of the blocks or packets to generate corresponding transformed data;
 (d) check a quality of representation of the transformed data of the blocks or packets compared to the content of the blocks or packets prior to application of the plurality of mutually different transformations or combinations of transformations to select one or more coding methods for individual blocks or packets;
 (e) encode the input data with the selected one or more coding methods to generate encoded output data for each channel separately; and
 (f) communicate in the encoded output data information describing the plurality of mutually different transformations or combinations of transformations employed when coding the blocks or packets separately for each channel.

21. An encoder operable to encode input data to generate corresponding encoded output data, comprising data processing hardware which is operable:
 (a) to process the input data containing multiple channels to separate channels,
 (b) to process each channel into a plurality of blocks or packets, the blocks or packets having a size depending upon one or more parameters describing data content or data type of the input data, and the blocks or packets being of one or more sizes;
 (c) to apply a plurality of mutually different transformations or combinations of transformations to content of the blocks or packets to generate corresponding transformed data;
 (d) to check a quality of representation of the transformed data of the blocks or packets compared to the content of the blocks or packets prior to application of the plurality of mutually different transformations or combinations of transformations to select one or more coding methods for individual blocks or packets;

(e) encode the input data with the selected one or more coding methods to generate encoded output data for each channel separately; and (f) to communicate in the encoded output data information describing the plurality of mutually different transformations or combinations or transformations employed when coding the blocks or packets separately for each channel.

22. The encoder as claimed in claim 21, wherein the data processing hardware is operable to use the plurality of mutually different transformations or combinations of transformations to compress content associated with the blocks or packets, so that the encoded output data is smaller in size than the input data to be encoded.

23. The encoder as claimed in claim 21, wherein the data processing hardware is operable to arrange for the one or more quality criteria to be dynamically variable during encoding of the blocks or packets depending upon the one or more parameters describing content included within the blocks or packets.

24. The encoder as claimed in claim 21, wherein the blocks or packets are sub-divided or combined so that the content of the blocks or packets described by at least one of representative parameters is substantially flat.

25. The encoder as claimed in claim 21, wherein the blocks or packets correspond to a series of data, wherein sub-division of the input data corresponding to a given information to form the plurality of corresponding blocks is made dependent upon content present in one or more data preceding the given information within the temporal sequence of data.

26. The encoder as claimed in claim 21, wherein the data processing hardware is operable to add header information to the transformed data to generate the encoded output data, wherein the header information includes information indicative of the plurality of mutually different transformations or combinations of transformations employed by the encoder.

27. The encoder as claimed in claim 21, wherein the data processing hardware is operable to retrieve supplementary information from a database arrangement for use when executing the plurality of mutually different transformations or combinations of transformations, wherein the supplementary information includes at least one of: algorithms, rules, or one or more transformation parameters.

28. The encoder as claimed in claim 27, wherein the data processing hardware is operable to add header information to the encoded output data in a manner indicative of the database arrangement for enabling subsequent decoding of the encoded output data to access the supplementary information when decoding the encoded output data.

29. The encoder as claimed in claim 21, wherein the data processing hardware is operable to employ for the transformations two or more of: data base coding method, a DC-value coding method, slide coding method, scale coding method, line coding method, multilevel coding method, unchanged coding method, interpolation coding method, extrapolation coding method, Discrete Cosine Transform (DCT), pulse code modulation (PCM), Differential Pulse Code Modulation (DPCM), Run-Length Encoding (RLE), Split run-length encoding (SRLE), bzip2-specific RLE, Entropy Modifier, Lempel-Ziv Obehumer (LZO), Variable Length Coding (VLC), Huffman-coding, arithmetic coding, range coding, transform coding, delta coding, ODelta coding method, DDelta coding method, IDelta coding method, PDelta coding method, IntraMV coding method, InterMV coding method, color conversion coding method, quantization, wavelet transform, Hadamard transform, linear transform or inverse coding methods of all of the foregoing.

30. The encoder as claimed in claim 21, wherein the encoder further comprises a single processing unit.

31. The encoder as claimed in claim 21, wherein the encoder further comprises a single memory device.

32. The encoder as claimed in claim 21, wherein the one or more parameters further relate to at least one of constant value, sliding parameter value, or repetitive pattern.

33. The encoder as claimed in claim 21, wherein the data processing hardware is operable to provide the one or more parameters describing the data content or data type of the input data in the encoded output data.

34. The encoder as claimed in claim 21, wherein the data processing hardware is operable to:

in an event that the quality of representation of the transformed data of one or more blocks or packets does not satisfy the one or more quality criteria, divide or combine the one or more individual blocks or packets whose quality of representation do not satisfy the one or more criteria further and to repeat step (c) for the one or more blocks or packets whose quality of representation does not satisfy the one or more criteria, for each channel separately;

provide information indicative of dividing or combining the one or more individual blocks or packets in the encoded output data for each channel separately.

35. The encoder as claimed in claim 21, wherein the data processing hardware is operable to provide the plurality of mutually different transformations or combinations of transformations within the selection of one or more coding methods in the encoded output data.

* * * * *